US011923245B2

(12) United States Patent
Selim

(10) Patent No.: US 11,923,245 B2
(45) Date of Patent: Mar. 5, 2024

(54) LIGHT-DRIVEN TRANSITION FROM INSULATOR TO CONDUCTOR

(71) Applicant: Bowling Green State University, Bowling Green, OH (US)

(72) Inventor: Farida Selim, Bowling Green, OH (US)

(73) Assignee: Bowling Green State University, Bowling Green, OH (US)

(*) Notice: Subject to any disclaimer, the term of this patent is extended or adjusted under 35 U.S.C. 154(b) by 98 days.

(21) Appl. No.: 17/795,900

(22) PCT Filed: Feb. 3, 2021

(86) PCT No.: PCT/US2021/016332
§ 371 (c)(1),
(2) Date: Jul. 28, 2022

(87) PCT Pub. No.: WO2021/158608
PCT Pub. Date: Aug. 12, 2021

(65) Prior Publication Data

US 2023/0101586 A1 Mar. 30, 2023

Related U.S. Application Data

(60) Provisional application No. 62/970,349, filed on Feb. 5, 2020.

(51) Int. Cl.

| | |
|---|---|
| ***H01L 21/768*** | (2006.01) |
| ***H01L 21/02*** | (2006.01) |
| ***H01L 29/778*** | (2006.01) |

(52) U.S. Cl.
CPC .. *H01L 21/76886* (2013.01); *H01L 21/02172* (2013.01); *H01L 21/02241* (2013.01); *H01L 21/02345* (2013.01); *H01L 29/7783* (2013.01)

(58) Field of Classification Search
CPC .................... H01L 21/02345; H01L 21/76886
See application file for complete search history.

(56) References Cited

U.S. PATENT DOCUMENTS

| | | | | |
|---|---|---|---|---|
| 2005/0279279 | A1* | 12/2005 | Hosono | C01F 7/164 117/70 |
| 2006/0151311 | A1* | 7/2006 | Hosono | C04B 35/653 204/157.5 |
| 2009/0163647 | A1 | 6/2009 | Deluca et al. | |

(Continued)

FOREIGN PATENT DOCUMENTS

| | | | |
|---|---|---|---|
| WO | 2018189205 | A1 | 10/2018 |

OTHER PUBLICATIONS

Hussain, et al. "Electronic structure, mechanical, and optical properties of CaO-Al2O3 system: a first principles approach" in Indian Journal of Physics, DOI 10.1007/s12648-015-0830-5 (Year: 2016).*

(Continued)

*Primary Examiner* — Erik Kielin
(74) *Attorney, Agent, or Firm* — MacMillan, Sobanski & Todd, LLC

(57) ABSTRACT

Methods for inducing reversible or permanent conductivity in wide band gap metal oxides such as $Ga_2O_3$, using light without doping, as well as related compositions and devices, are described.

18 Claims, 23 Drawing Sheets
(22 of 23 Drawing Sheet(s) Filed in Color)

Experimental Procedure Diagram

I 3.1 ev Photo-excitation
II Anneal at 310 °C for 10 min
III Cool down to room temperature
IV Measure conductivity and carrier density at room temperature
V Anneal at 320 °C for 10 min
VI Cool down to room temperature
VII Measure conductivity and carrier density at room temperature Repeat steps of annealing and Cooling down with increment of 10 °C

(56) References Cited

U.S. PATENT DOCUMENTS

| | | | |
|---|---|---|---|
| 2015/0050430 | A1 | 2/2015 | Muecke et al. |
| 2019/0348505 | A1 | 11/2019 | Inoue et al. |

OTHER PUBLICATIONS

Saadatkia, "Optoelectronic Properties Of Wide Band Gap Semiconductors", A Dissertation Submitted to The College of Bowling Green State University, Aug. 2019, pages iii, iv, 1, 7-23, 110-134.

PCT International Search Report and Written Opinion, Application No. PCT/US2021/016332, dated Apr. 27, 2021.

* cited by examiner

LIGHT-DRIVEN TRANSITION FROM INSULATOR TO CONDUCTOR

RELATED APPLICATIONS

This is the national phase entry of international application PCT/US2021/016322, filed under the authority of the Patent Cooperation Treaty on Feb. 3, 2021, published; which claims priority to U.S. Provisional Application No. 62/970,349, filed under 35 U.S.C. § 111(b) on Feb. 5, 2020. The entire disclosure of each of the aforementioned applications is incorporated herein by reference for all purposes.

STATEMENT REGARDING FEDERALLY SPONSORED RESEARCH

This invention was made with no government support. The government has no rights in this invention.

BACKGROUND

Gallium oxide ($Ga_2O_3$) is a desirable material for many optoelectronic applications. However, there is a lack of methods for producing conductive $Ga_2O_3$ materials, despite such materials being highly desired for certain types of devices. It would be advantageous to develop methods for producing conductive $Ga_2O_3$ materials.

SUMMARY

Provided is a method for producing a conductive material, the method comprising exposing a wide band gap metal oxide having oxygen vacancies to sub-band gap light for a period of time to induce conductivity in the wide band gap metal oxide and produce a conductive metal oxide having either reversible conductivity or permanent conductivity.

In certain embodiments, wide band gap metal oxide comprises $Ga_2O_3$. In certain embodiments, the method further comprises raising the temperature of the wide band gap metal oxide to an elevated temperature to eliminate the reversible conductivity. In certain embodiments, the conductive metal oxide comprises $Ga_2O_3$ having reversible conductivity. In certain embodiments, the conductive metal oxide has reversible conductivity and is in an optical memory device. In certain embodiments, the sub-band gap light is at an intensity of about $1.81\times10^{17}$ photons/$cm^2$ s, and the period of time is at least 1 hour. In particular embodiments, the wide band gap metal oxide with induced conductivity comprises n-type $Ga_2O_3$ with permanent conductivity. In particular embodiments, the method further comprises making an electronic device with the n-type $Ga_2O_3$.

In certain embodiments, the sub-band gap light is at an energy ranging from about 1.45 eV to about 3.39 eV. In certain embodiments, the sub-band gap light is at an energy of about 3.1 eV.

In certain embodiments, the period of time ranges from about 1 minute to about 100 hours. In certain embodiments, the period of time ranges from about 1 hour to about 70 hours. In certain embodiments, the period of time is at least about 1 hour. In certain embodiments, the period of time is at least about 70 hours.

In certain embodiments, the sub-band gap light has an intensity ranging from about $1\times10^{15}$ photons/$cm^2$·s to about $1\times10^{19}$ photons/$cm^2$·s. In certain embodiments, the sub-band gap light has an intensity of about $1.81\times10^{17}$ photons/$cm^2$·s.

Further provided is a method for producing a conductor, the method comprising exposing an insulator material to light at a sufficient energy and intensity, and for a sufficient time, to induce permanent conductivity in the insulator material and thereby produce a conductor material. In certain embodiments, the insulator material comprises a wide band gap metal oxide having oxygen vacancies. In certain embodiments, the insulator material comprises $Ga_2O_3$ having oxygen vacancies. In certain embodiments, the insulator material is undoped. In certain embodiments, the method does not involve doping the insulator material.

Further provided is a method of reversing conductivity in a material, the method comprising heating a wide band gap metal oxide material having reversible conductivity to an elevated temperature to substantially eliminate the conductivity of the wide band gap metal oxide material. In certain embodiments, the wide band gap metal oxide material comprises oxygen vacancies. In particular embodiments, the wide band gap metal oxide material comprises $Ga_2O_3$. In certain embodiments, the elevated temperature is at least about 36° C. In certain embodiments, the elevated temperature is at least about 100° C.

Further provided is a method for tuning material properties, the method comprising providing a wide band gap metal oxide material having oxygen vancancies; and exposing the wide band gap metal oxide material to a desired intensity of sub-band gap light for a desired amount of time so as to induce conductivity in the wide band gap metal oxide material and tune the conductivity in a desired manner. In certain embodiments, the wide band gap metal oxide material comprises $Ga_2O_3$.

Further provided is a method of removing conductivity in a material, the method comprising heating a wide band gap metal oxide with permanent conductivity to an elevated temperature in the presence of oxygen so as to close oxygen vacancies in the wide band gap metal oxide and thereby remove the conductivity in the material, wherein the elevated temperature is at least about 800° C.

Further provided is a composition comprising $Ga_2O_3$ with reversible conductivity, wherein the reversible conductivity decays over time and is substantially removable by heating the composition to an elevated temperature. In certain embodiments, the composition is not doped. Further provided are optical memory devices comprises the composition.

Further provided is a composition comprising undoped n-type $Ga_2O_3$, wherein the $Ga_2O_3$ has a conductivity on the order of 1.0 $\Omega^{-}\cdot cm^{-1}$. Further provided are electronic devices comprising the composition.

Further provided is an optical memory device comprising a wide band gap metal oxide with oxygen vacancies having reversible conductivity, wherein the reversible conductivity is reversible by slightly elevating the temperature of the wide band gap metal oxide.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 1A shows a schematic showing light-induced transition of electrons from localized states within the gap to the conduction band. FIG. 1B shows dependence of photo-conductivity on photo-excitation energy and intensity at room temperature. The initial dark conductivity before illuminating with 2.69 eV photons was on the order of $10^{-6}$ $ohm^{-1} \cdot cm^{-1}$, which is one order of magnitude higher than the initial value in other measurements. This increase in dark conductivity was due to the exposure of the sample to room light. FIG. 1C shows dependence of photo-conductivity and photo-induced charge carrier density on photon energy at room temperature.

FIG. 3A shows a diagram showing the experimental work flow. FIG. 3B shows conductivity and carrier density versus annealing temperature. FIG. 3C shows the log of carrier density vs 1/kT, where k is the Boltzmann constant and T is temperature in Kelvin. FIG. 3D shows a schematic showing the excitation of an electron from the defect state to the conduction band and the thermal barrier energy for electron recapture.

FIG. 5A shows photo-conductivity after exposing the sample to light with different photon energies for one hour. FIG. 5B shows photo-conductivity after exposing the sample to 3.1 eV photoexcitation. The blue curve represents the decay in conductivity after illuminating the sample for 70 hours. After the initial decay in conductivity, the sample was exposed again to higher photon intensity for about 10 minutes (red curve). These results illustrate the dependence of the conductivity decay rate on the energy, intensity, and time of photoexcitation as well as on the repeated exposure to light.

FIG. 7A shows sheet resistance and sheet number as a function of temperature and FIG. 7B shows the Ln of sheet number as a function of inverse temperature. The measurements reveal a freeze out region for charge carriers, indicating that the induced new states are shallow states within the band gap and not in the conduction band.

FIG. 8A shows the pristine structure, FIG. 8B shows the internal structural arrangement with neutral oxygen vacancy, and FIG. 8C shows the internal structural arrangement with doubly charged oxygen vacancy. Variation in the distance of Ga atoms from the vacancy is also shown. Red and green arrows with indicated values show how much Ga atoms move towards or away from the vacancy, respectively. Grey and orange balls represent Ga and O atoms, respectively.

DETAILED DESCRIPTION

Figure 1A:
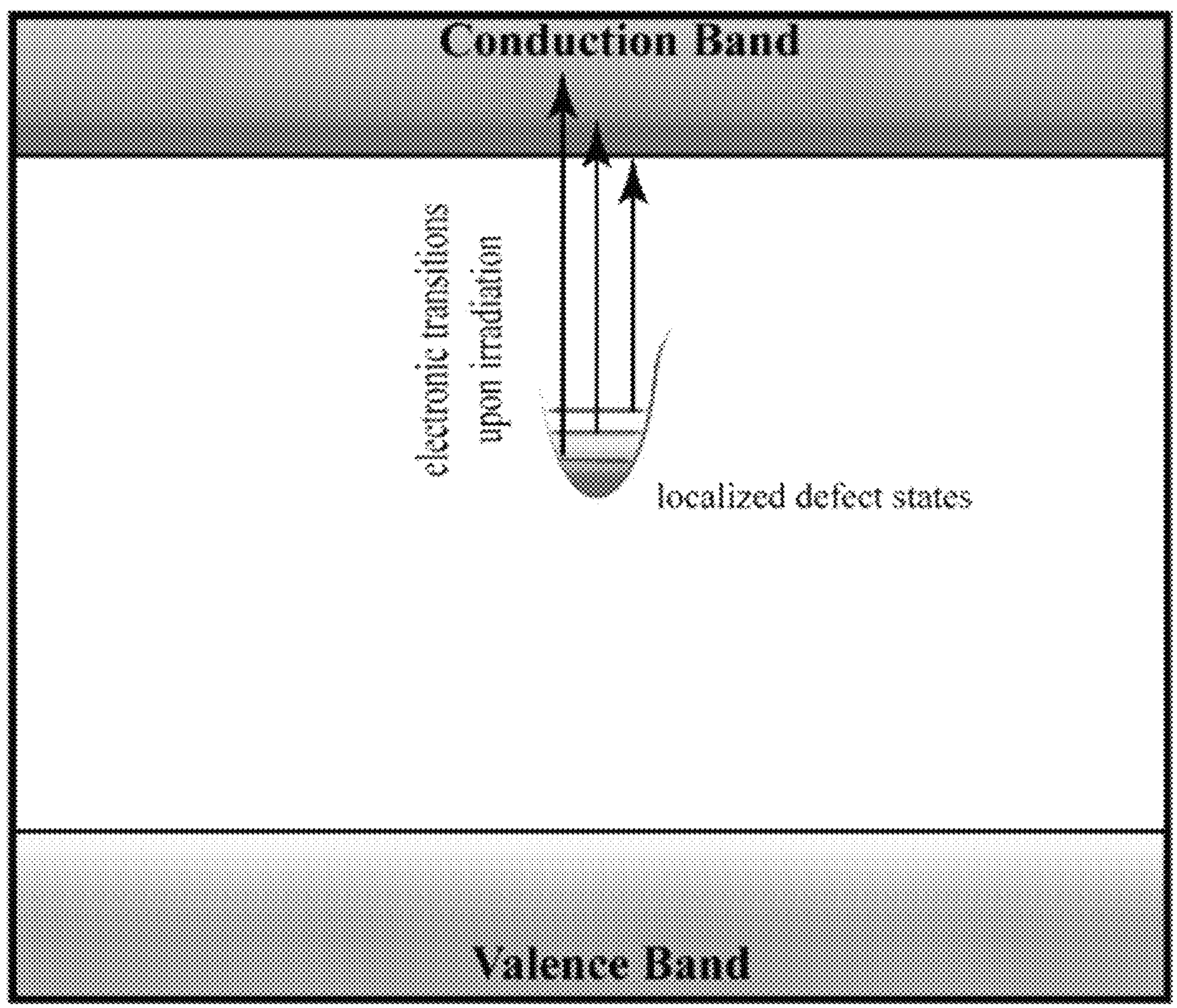
FIGS. 1A-1C: Photoconductivity in undoped β-$Ga_2O_3$ bulk crystals.

Throughout this disclosure, various publications, patents, and published patent specifications are referenced by an identifying citation. The disclosures of these publications, patents, and published patent specifications are hereby incorporated by reference into the present disclosure in their entirety to more fully describe the state of the art to which this invention pertains.

In accordance with the present disclosure, photoconductivity can be induced in certain wide band gap metal oxides having oxygen vacancies through the exposure to light of a certain energy and intensity, and for a certain time. Two distinct effects are possible: reversible conductivity and permanent conductivity. The photoconductivity can be reversible, in which case the conductivity decays over time and can also be reduced or eliminated by elevating the temperature of the material, or the photoconductivity can be permanent, in which the conductivity does not decay over time and cannot be eliminated without heating the material to an extremely high temperature in the presence of oxygen. The present disclosure thus provides for the conversion of an insulator into a conductor by applying light to the material.

The light used to induce photoconductivity may be provided from any light source, such as a light emitting diode (LED), and is generally sub-band gap light. In other words, the light has an energy that is below the band gap of the material being exposed to the light. Upon the exposure of sub-band gap light, electrons are pumped into the conduction band from defect levels. Without wishing to be bound by theory, it is believed that the lattice structure of the material contracts upon the removal of the electrons from the defect levels, causing a different distribution of electrons in the lattice structure. This moves the energy levels of the oxygen vacancies in the material, causing the oxygen vacancies to become shallow donors.

The variables of light intensity and duration of light exposure (i.e., photoexcitation time, also referred to as illumination time) work together to determine whether the resulting material has reversible conductivity or permanent conductivity. For shorter exposure times and lesser intensities, the conduction is reversible. For longer exposure times and greater intensities, the conduction is permanent. Permanent conductivity can still be achieved with a short exposure time by using a great intensity, and with a small intensity by using a long exposure time. The light intensity may range from about $1\times10^{15}$ photons/$cm^2$·s to about $1\times10^{19}$ photons/$cm^2$·s. In one non-limiting example, the light intensity is about $1.81\times10^{17}$ photons/cm$^2$·s. The photoexcitation time may range from about 1 minute to about 150 hours, or from about 30 minutes to about 100 hours, or from about 1 hour to about 70 hours. In some embodiments, the photoexcitation time is at least about 1 hour. In some embodiments, the photoexcitation time is at least about 70 hours. In one non-limiting example, the light intensity is about $1.81\times10^{17}$ photons/cm$^2$·s, and the illumination time is about 1 hour.

Though the present disclosure is not limited to any one particular material, and may, in fact be applicable to any wide band gap metal oxide having oxygen vacancies, $Ga_2O_3$ is described herein for example purposes. $Ga_2O_3$ with oxygen vacancies can be grown, for example, by using oxide rich conditions.

In a first aspect, a $Ga_2O_3$ single crystal that contains oxygen vacancies can be exposed to sub-band gap light for a limited time to create conductivity. Exposing a $Ga_2O_3$ single crystal that contains oxygen vacancies to sub-band gap light for a limited time, for example by limiting the excitation time or decreasing the photon intensity, may create reversible conductivity. This reversible conductivity can then be erased by raising the temperature slightly above room temperature, as illustrated and confirmed in FIGS. 3A-3D. This method can be used for developing optical memory devices. Thus, further provided herein are compositions and devices (such as optical memory devices) comprising a wide band gap metal oxide, such as undoped $Ga_2O_3$, having reversible conductivity, where the reversible conductivity is removable by elevating the temperature of the wide band gap metal oxide.

The measurements described in the examples herein also demonstrate that sub-band gap light illumination of undoped $Ga_2O_3$ for an extended time leads to a permanent transition from a highly insulating state to a conductive state that cannot be reversed, i.e., creating permanent conductivity. In other words, permanent conductivity can be induced into wide band gap metal oxides, such as $Ga_2O_3$, converting the material from an insulator to a conductor, using light without doping. Undoped single crystals of $Ga_2O_3$ that contain oxygen vacancies can be exposed to visible light while controlling the light energy and intensity, and the exposure time to the light, to accomplish this. Thus, in a second aspect, $Ga_2O_3$ single crystals that contain oxygen vacancies can be exposed to high intensity sub-band gap light for an extended time (FIGS. 4-6), then the light can be turned off to develop an undoped n-type $Ga_2O_3$ semiconductor material. This method can be used for developing electronics.

Figure 6:
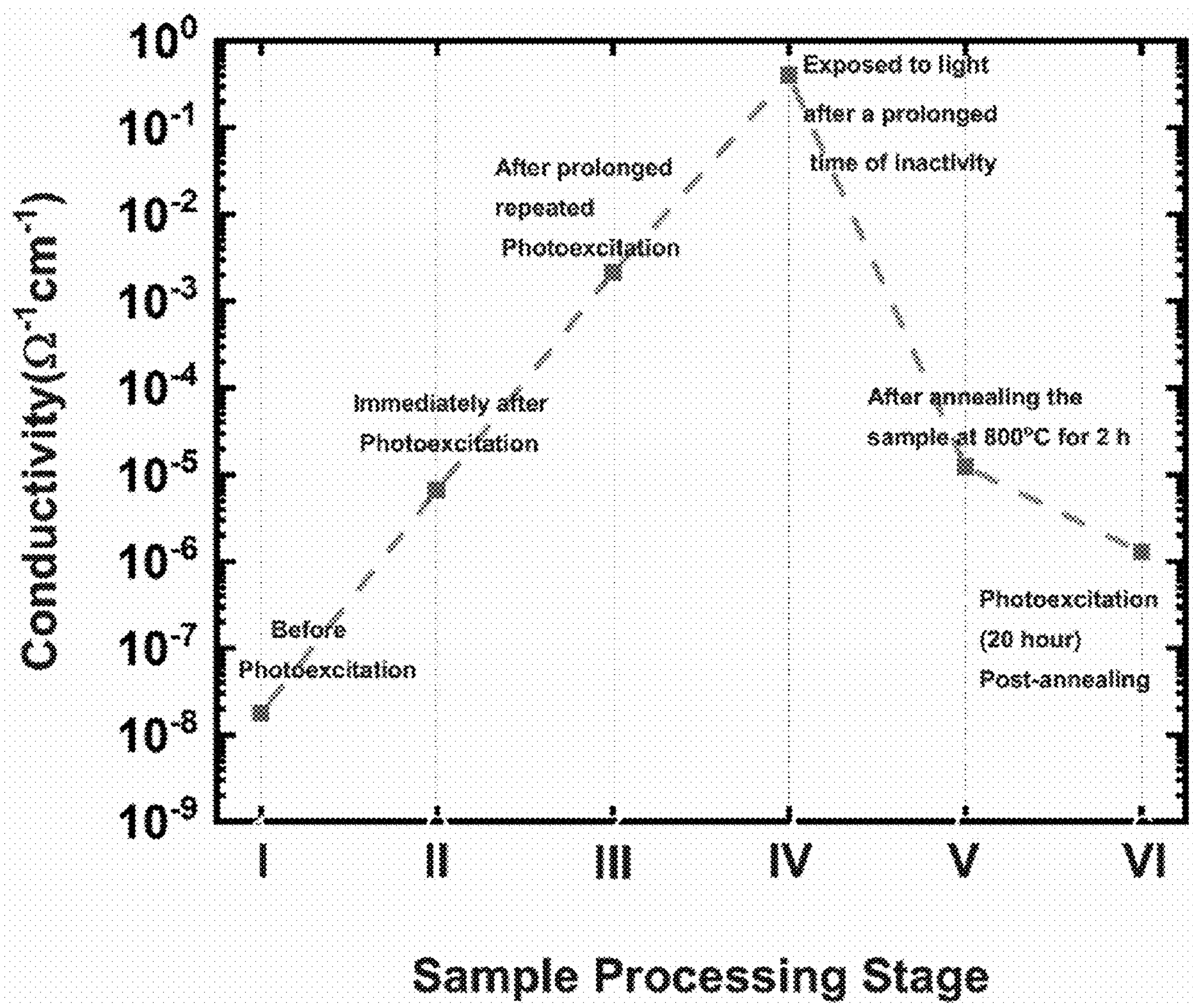
FIG. 6: Change in electron conduction in undoped β-$Ga_2O_3$ after exposing to photo-excitation and after annealing. After repeated photo-excitation at 3.1 eV, the conductivity increased 9 orders of magnitude from $10^{-8}$ to almost 1 $\Omega^{-1}$ $cm^{-1}$ and retained this conductivity without decay, indicating a transition from insulator state to conductor state. Then, the conductivity was suppressed to about $10^{-6}\Omega^{-1}$ $cm^{-1}$ by annealing the sample at 800° C. in $O_2$ for 2 hours. After annealing, prolonged re-photoexcitation for 20 hours did not increase the conductivity. On the contrary, it further decreased it, illustrating that the sample lost all its photoconductivity feature by high temperature annealing in $O_2$.

$\beta$-$Ga_2O_3$ is a highly resistive semiconducting oxide due to its wide band gap. The conversion of a highly insulating material to a conductive material just by exposing the material to light for a period of time is very unusual and surprising. In the examples herein, this phenomenon is demonstrated with $Ga_2O_3$, which is a very useful material for various types of devices. Permanent transition from a highly insulating state to a conductive state that cannot be reversed (except under extremely high temperatures, such as 800° C., in the presence of oxygen as seen in FIG. 6) is an unusual and surprising phenomenon with vast implications on both the properties and possible applications of the material. This phenomenon may be utilized, for example, in association with various n-type $Ga_2O_3$ based devices and technology, including optical memory devices and electronics in which $Ga_2O_3$ serves as a semiconductor. Thus, further provided herein are compositions and electronic devices comprising n-type $Ga_2O_3$, wherein the n-type $Ga_2O_3$ is undoped and has a conductivity on the order of 1.0 $\Omega^{-1}$ cm$^{-1}$.

The dependence of the decay of conductivity on photoexcitation time and intensity enables the possibility of tuning material properties and developing devices that can be controlled by light. In particular, as one non-limiting example, optical memory devices can be fabricated that rely on the induction and removal of photoconductivity in a material such as $Ga_2O_3$. Optical memory devices rely on the storage of data on an optically readable medium. Data may be recorded by making marks in a pattern that can be read back with the aid of light, such as a laser beam precisely focused on a spinning optical disc. An optical memory device may include a wide band gap metal oxide material with oxygen vacancies such as $Ga_2O_3$ with oxygen vacancies, a light source (such as a laser) for exposing the material to light so as to induce reversible conductivity in the material, and an energy source (such as the same or a different laser) for elevating the temperature of the material so as to substantially remove the conductivity.

EXAMPLES

The transition from insulator to conductor can be achieved in some materials but involves modification of both the arrangement of atoms and their electronic configurations. This is often achieved by doping. In these examples, a mechanism the lattice may adopt to induce such a transition is demonstrated. It is shown that limited extended exposure to sub-band gap light causes a permanent transition from an insulator state to a conductor state in the insulating oxide $Ga_2O_3$ with a 9-order of magnitude increase in electronic conduction. It is shown that the underlying mechanism is the photoexcitation modifies the charge state of an O-vacancy and the redistribution of the localized electrons, leading to a massive structural distortion in the $Ga_2O_3$ lattice. This modifies the density of states and introduces new stable states with shallower energy levels, leading to this intriguing behavior. This mechanism may occur in other wide band gap metal oxides, leading to drastic modification in their electronic properties.

When light is impinged on a semiconductor material, charge carriers—electrons and holes—may be generated, resulting in an enhancement in conductivity. If the energy of the incident photons is greater than the band gap of a semiconductor, it excites an electron from the valance band to the conduction band, a phenomenon called intrinsic photoconductivity. If the energy of the incident photons is less than the band gap, it may excite electrons from defect levels to the conduction band, enhancing conductivity. This is referred to as extrinsic photoconductivity. In either case, if the conductivity persists after turning off the photo excitation, it is known as persistent photoconductivity. In this situation, when the electron-hole pairs are generated, there must be microscopic or macroscopic potential barriers that separate charge carriers and reduce the probability of recombination between them, resulting in enhanced conductivity for a longer period of time.

Persistent photoconductivity at room temperature has been primarily reported in hetero-structures of semiconductors and in a few bulk materials. In these examples, an extrinsic persistent photoconductivity (referred to as reversible conductivity) behavior in bulk $Ga_2O_3$ and a surprising permanent transition from the insulator state to the conductor state upon exposure to sub-band gap light for a limited period of time are shown. First, $Ga_2O_3$ bulk crystal exhibited massive persistent photoconductivity upon exposing it to sub-band gap light of much lower energy than the band gap. Then, the induced metastable states created by light became stable only by increasing the photoexcitation time, leading to a permanent transition from the insulator state to the conductor state. Such behavior has vast implications on the material properties and applications.

$Ga_2O_3$ is the widest band gap transparent (up to UV-C range) semiconducting oxide known so far. Its ultra-wide band gap (~4.5-4.9 eV) may lead to unusual electronic phenomena. Due to this wide band gap, UV-C transparency, and excellent thermal and chemical stability, it has numerous possible applications in power and high voltage devices, Schottky diodes, field effect transistors, gas sensors, phosphors and electroluminescent devices, UV photo detectors, and more. $Ga_2O_3$ exhibits polymorphism, denoted by α, β, γ, δ, and, with β-$Ga_2O_3$ being the most stable phase from room temperature to its melting point. As the most stable form, β-$Ga_2O_3$ is also the most studied polymorph. It crystalizes into a monoclinic structure with space group C2/m and lattice parameters a=12.2140 □, b=3.03719 □, c=5.7819 □, and β=103.83°. It contains both octahedral and tetrahedral cation sites in equal numbers. As $Ga_2O_3$ has a wide band gap, it is an insulator at room temperature, but electron conduction has been reported when synthesized under reducing condition. Theoretical calculations show that oxygen vacancies are deep states and cannot provide conduction electrons. It has been also proposed that silicon, which is a major impurity in $Ga_2O_3$, may be the cause of electron conductivity. The effective hole condition in $Ga_2O_3$ has not been reported; theoretical calculations show that the valance band is flat, indicating larger effective mass for holes, making p-type conductivity difficult.

Figure 1B:
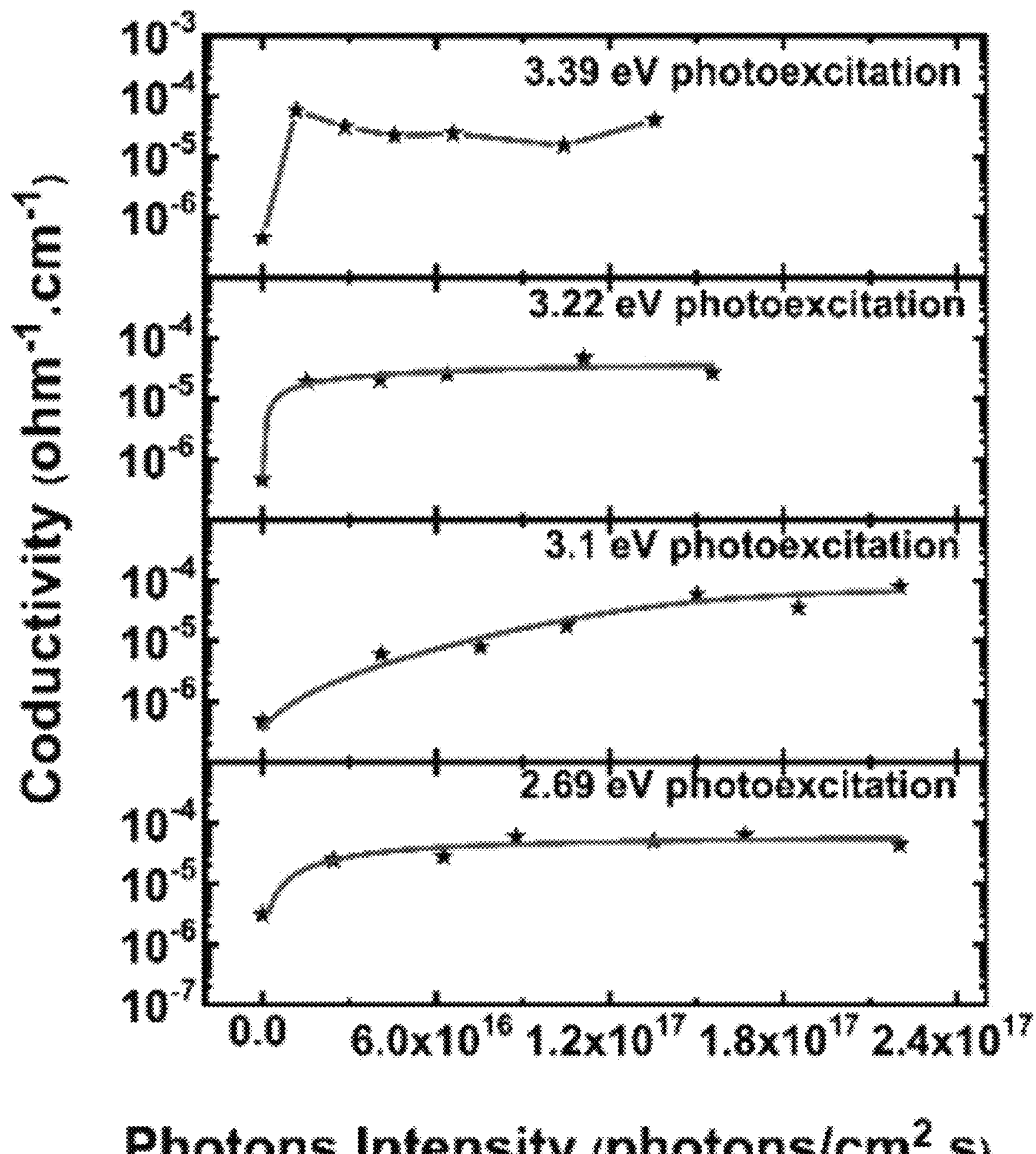
Figure 1C:
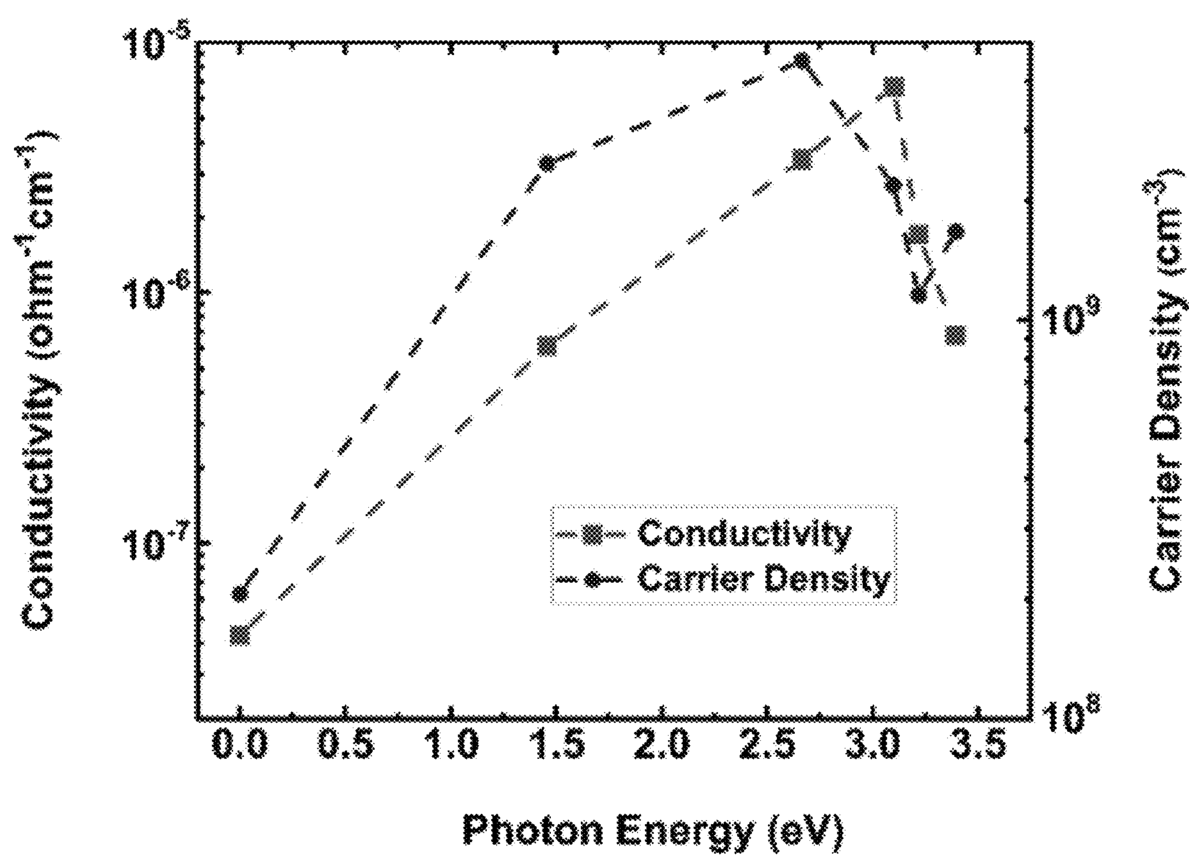
Figure 2:
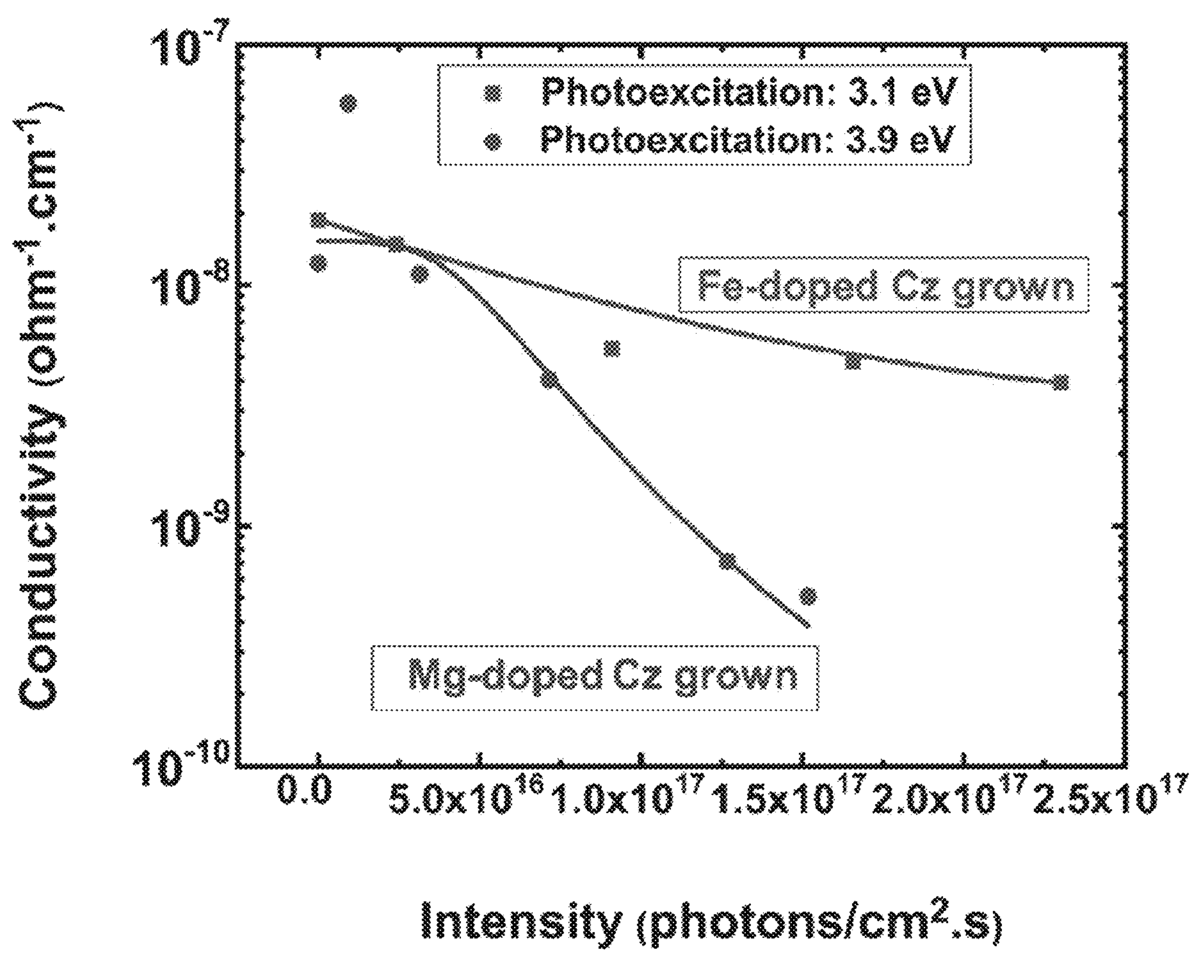
FIG. 2: Change in conductivity as a function of photon intensity in doped β-$Ga_2O_3$ bulk crystals: Fe-doped $Ga_2O_3$ and Mg-doped $Ga_2O_3$. Contrary to undoped crystals, the conductivity here decreased by exposing the samples to light, illustrating that impurities such as Fe and Mg do not play a role in the induced photoconductivity of $Ga_2O_3$.

Results and Discussion $Ga_2O_3$ single crystals were illuminated by sub-band gap light and the conductivity and carrier density were measured during illumination. FIGS. 1A-1C illustrate the dependence of photoconductivity in undoped β-$Ga_2O_3$ single crystals on photoexcitation energy and intensity. In FIG. 1B, the photoconductivity is plotted versus light intensity for photon energies of 3.39, 3.22, 3.1, and 2.69 eV, revealing that the conductivity abruptly increases at low photon intensity and quickly saturates. In FIG. 1C, the photoconductivity and photo-induced charge carrier density are plotted as a function of photon energy. Before each measurement, the sample was heated at 400° C. for 1 hour to retain its initial dark conductivity, and excitation was carried out at the same photon intensity for all energies. Interestingly, all sub-band gap photo-excitations led to an increase in conductivity, even at low energies of 1.9 and 1.45 eV. The maximum photoconductivity occurs at 3.1 eV, which is much below 3.5/3.9 eV, the band gap energy of $Ga_2O_3$. The increase of conductivity with sub-band gap photoexcitation can be explained due to the excitation of electrons from a localized state in the gap to the conduction band as shown in FIG. 1A. In contrast to undoped $Ga_2O_3$, Fe- and Mg-doped samples behave differently when exposed to light. Both Fe and Mg-doped crystals showed decreased conductivity when exposed to 400 nm and 365 nm light (FIG. 2). This indicates that common impurities in $Ga_2O_3$ such as Fe are not behind this photoconductivity.

Figure 3A:
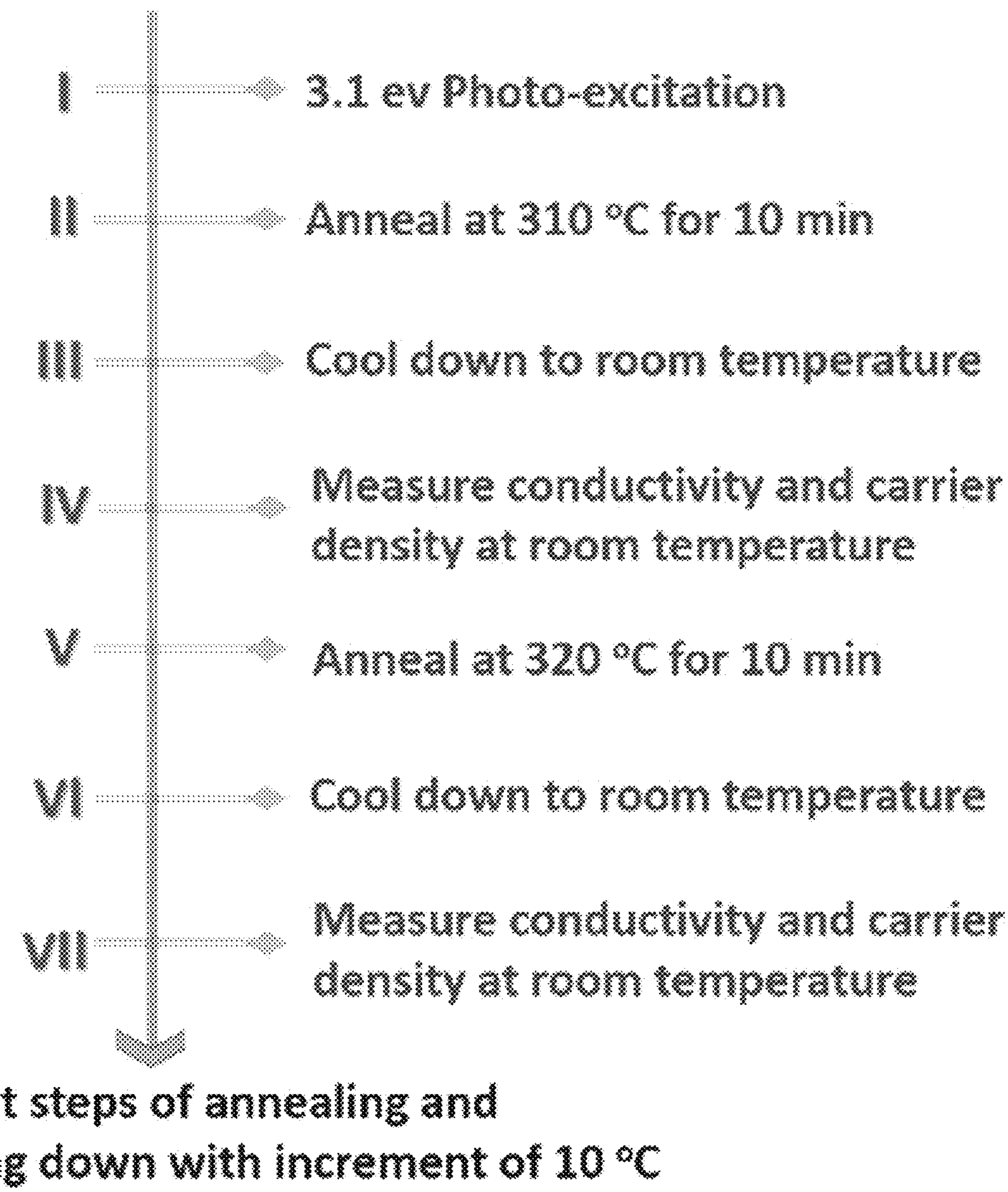
FIGS. 3A-3D: Decrease of conductivity and charge carrier density after photo-excitation with annealing temperature and calculation of the thermal barrier energy for electron recapture by defect.
Figure 3B:
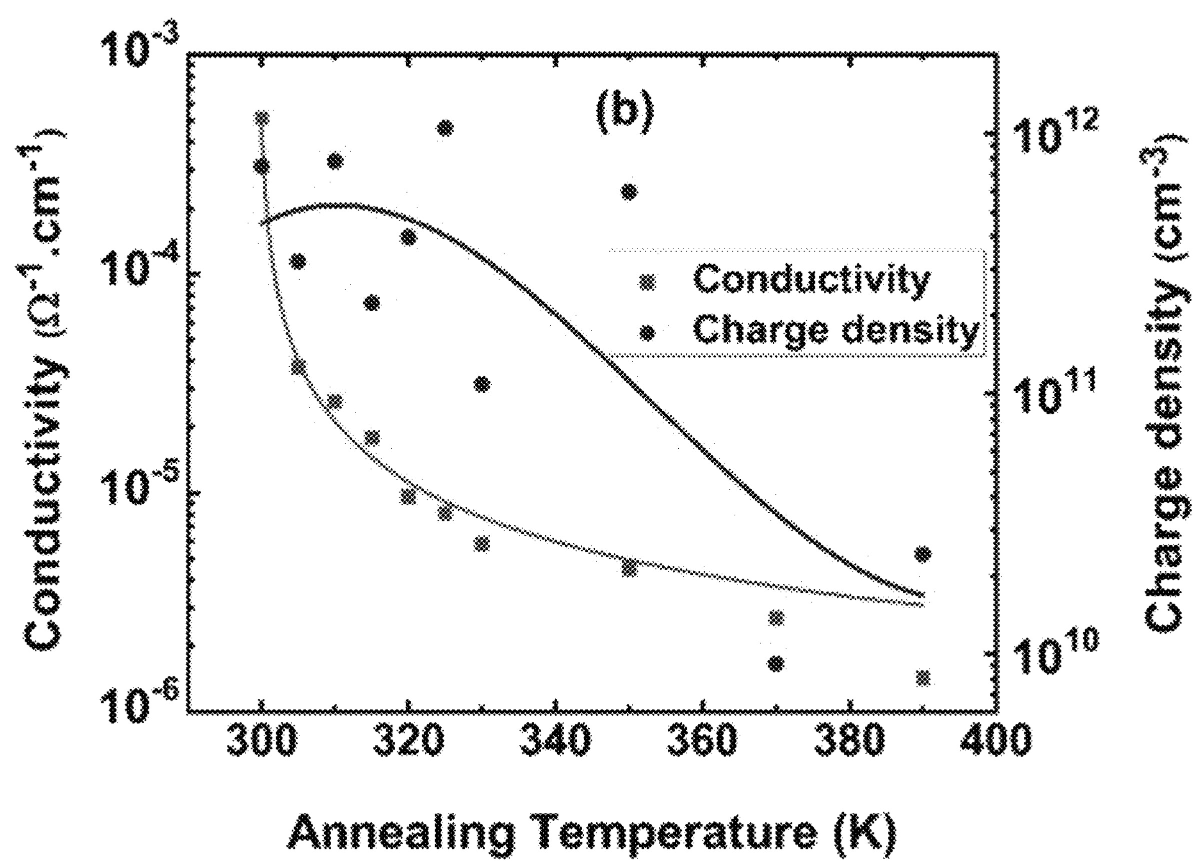
Figure 3C:
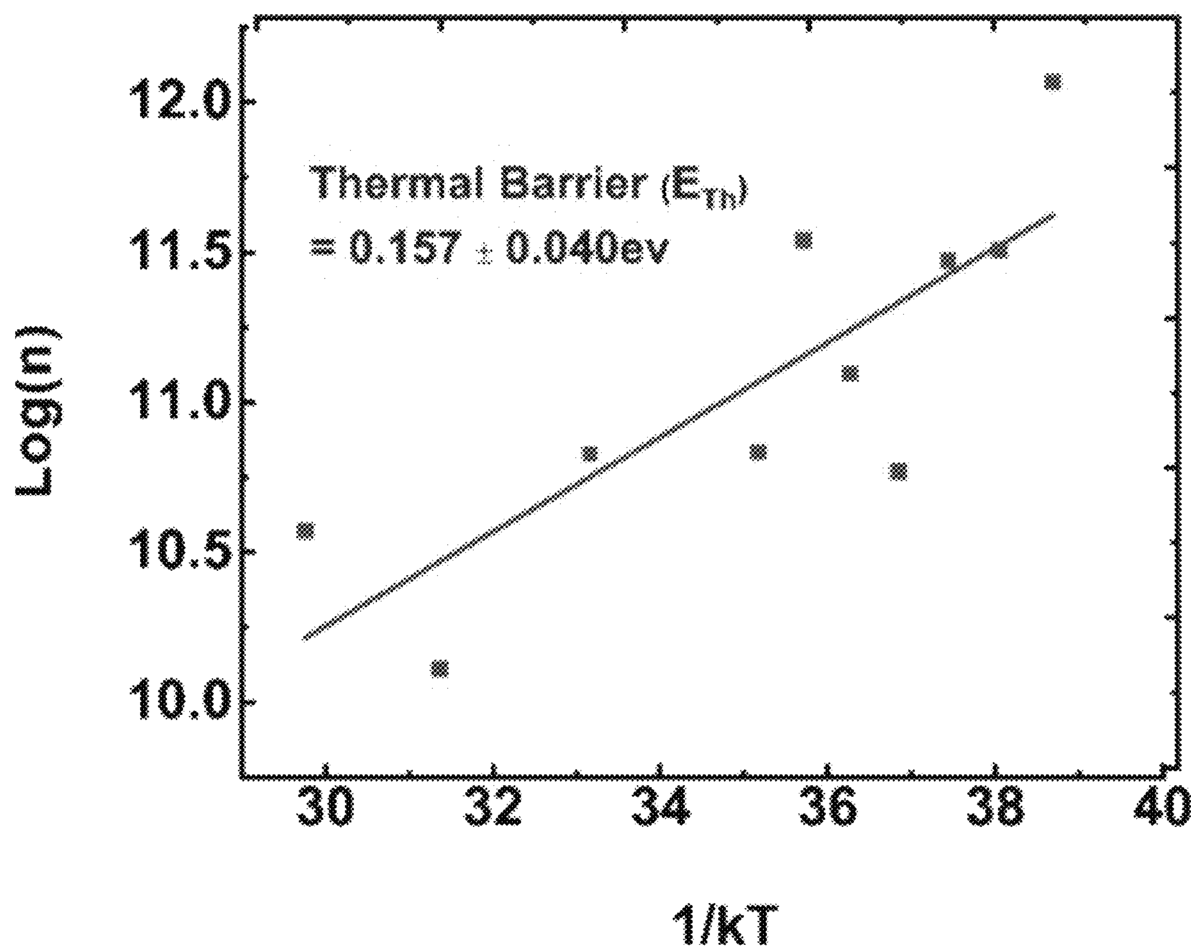
Figure 3D:
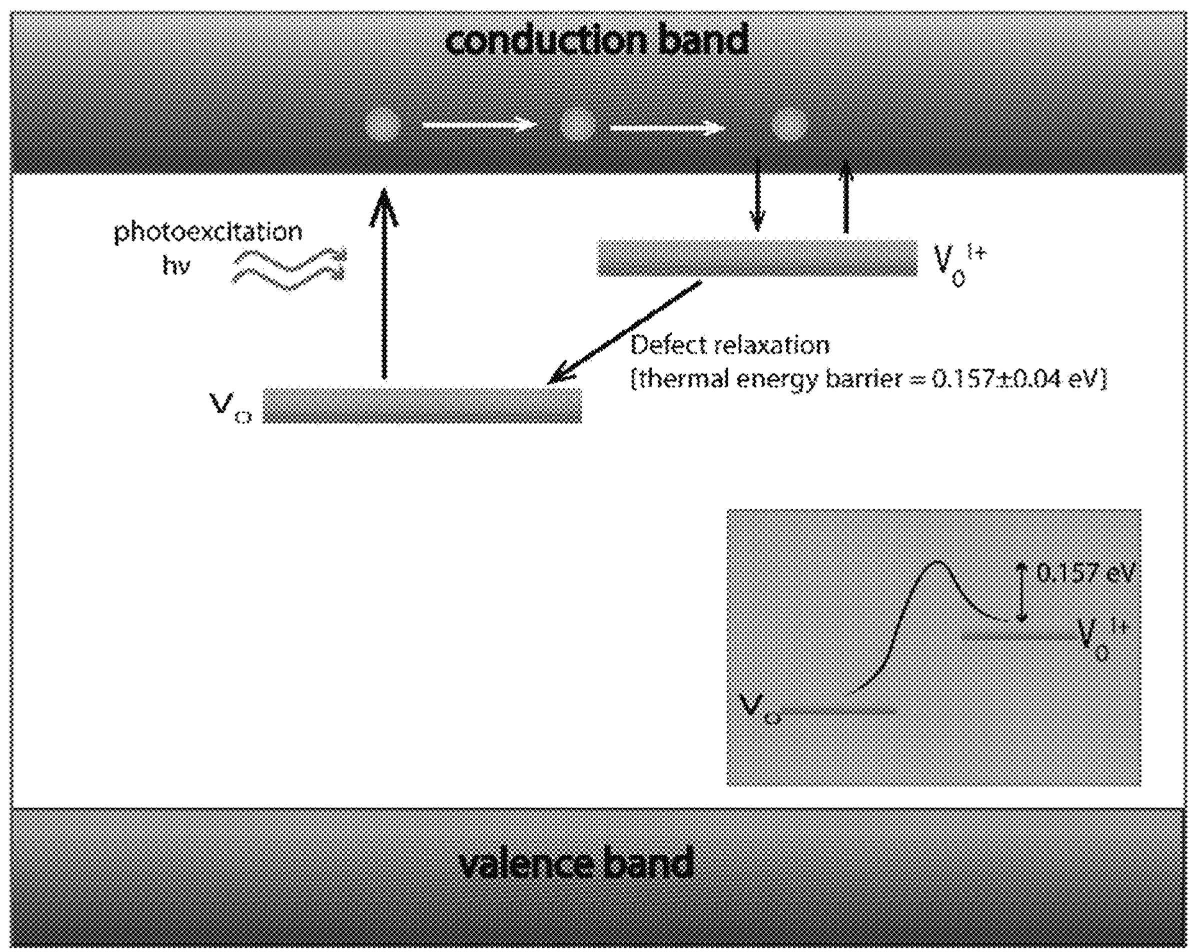

After turning off photo-excitation, the sample illuminated by 3.1 eV shows significant persistent photoconductivity. To calculate the associated potential barrier that prevents the recapture of charge carriers by their centers after light is turned off and is thus the ultimate origin of the persistent photoconductivity, the photoconductive sample was annealed at variable temperatures (from 300° C. to 390° C.) for 10 minutes at each temperature inside the Hall-effect chamber. After each anneal, the sample was then cooled to room temperature and the electrical conductivity and carrier density were measured. The steps of the experimental procedure are illustrated in FIG. 3A. FIG. 3B shows how the conductivity and charge carrier density of the sample vary with annealing temperature and FIG. 3C shows a corresponding graph of the natural logarithm of charge carrier density vs. reciprocal thermal energy (1/kT). Using the Arrhenius equation, n=Ae−Eth/kT, the slope of the best-fit line gives a thermal energy barrier of about 0.157±0.04 eV. In FIG. 3D, the process of electron pumping from the localized center to the conduction band is illustrated where the center relaxes to a metastable state, and the subsequent process of electron recapture through a barrier energy Eth is also illustrated. However, subsequent prolonged and repeated photo-excitation led to stable electron (i.e., permanent) conduction that does not decay even after heating up to 400° C. The decay of the induced conductivity and its dependence on photon energy, intensity, and illumination time are discussed in detail below.

Figure 4:
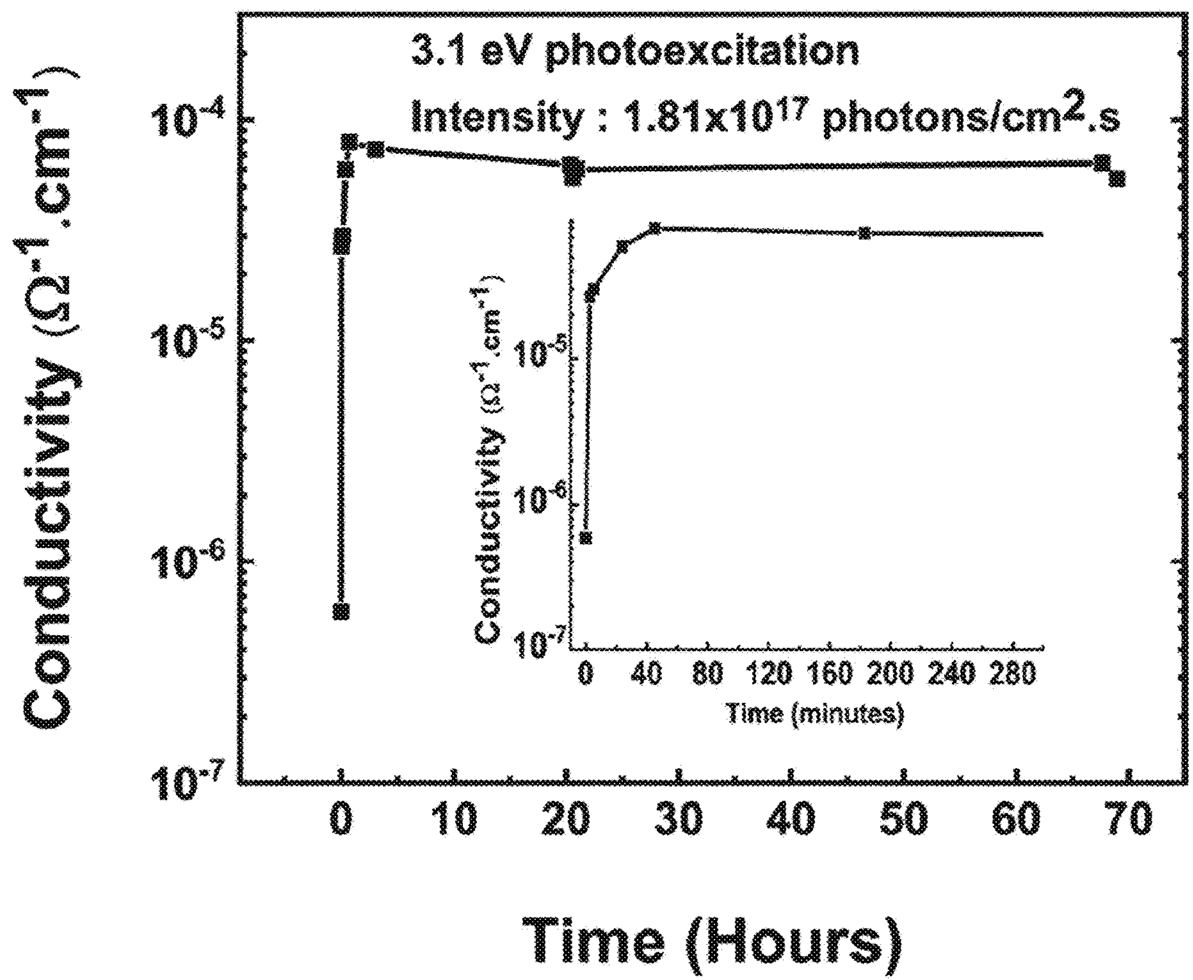
FIG. 4: Electrical conductivity as a function of illumination time (in-situ measurements with light on). The inset highlights the increase in conductivity with illumination in the first several hours showing saturation around 40 minutes.
Figure 5A:
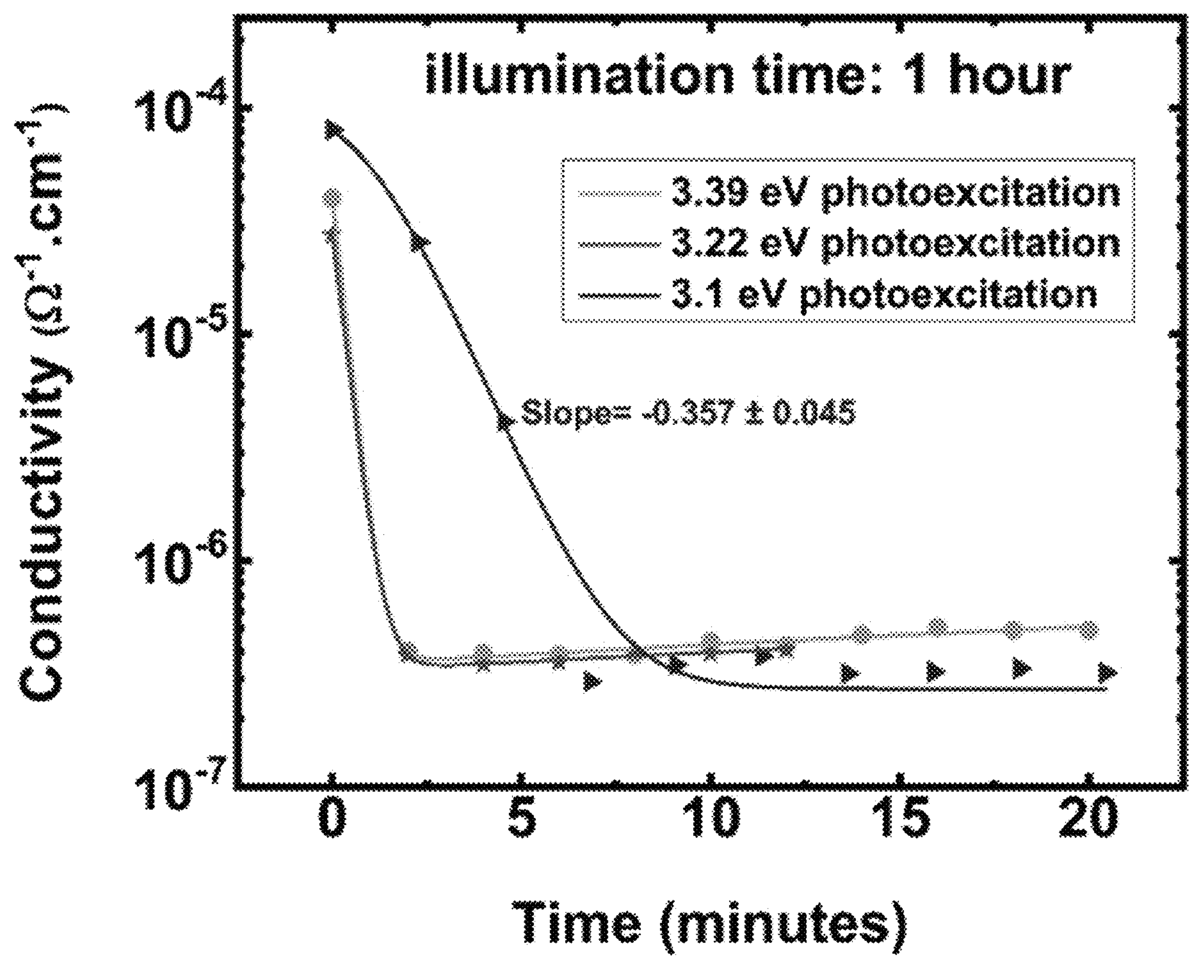
FIGS. 5A-5B: Decay of photo-conductivity as a function of time after turning off photoexcitation.
Figure 5B:
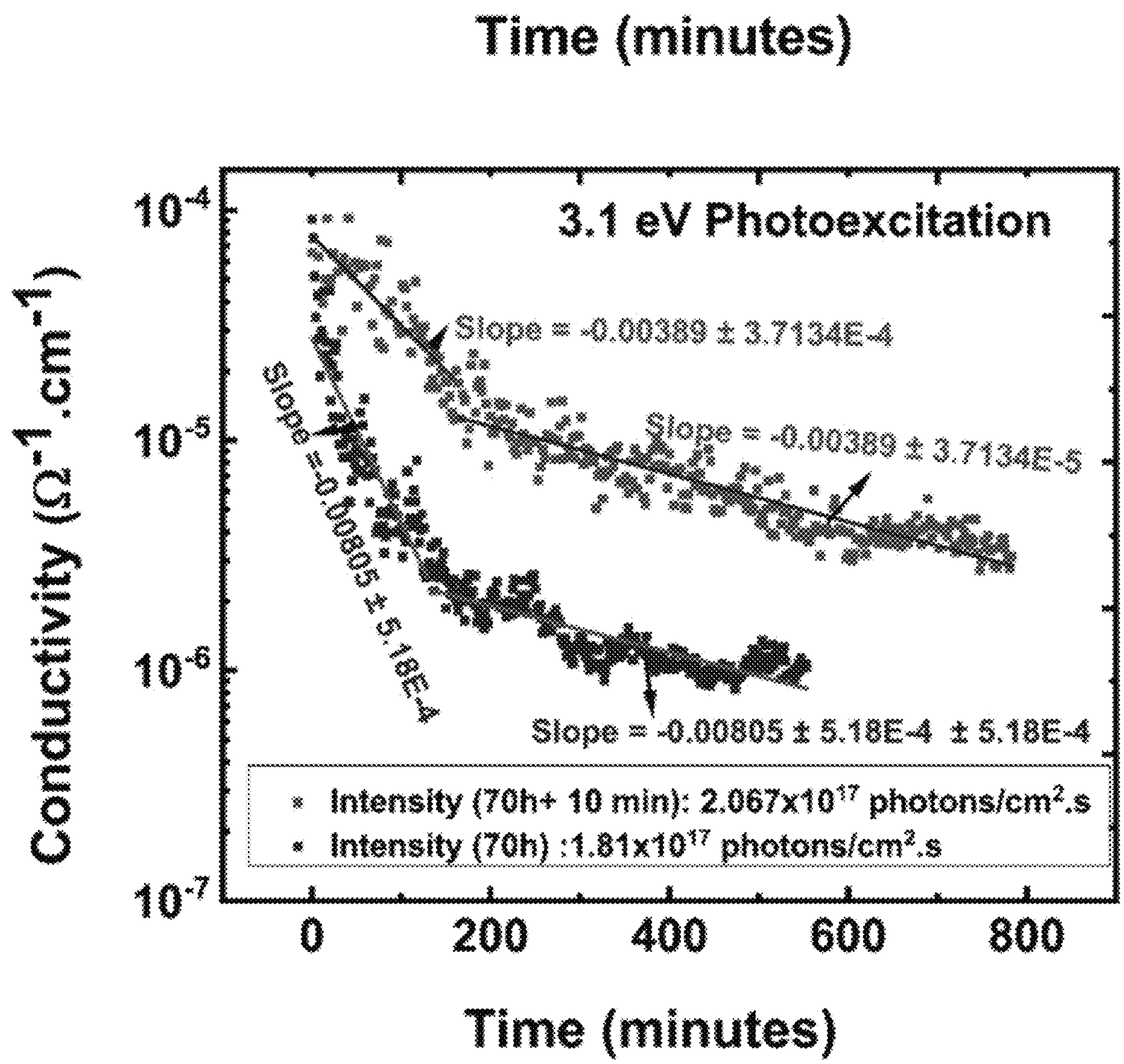

FIG. 4 shows the electrical conductivity of the sample as a function of illumination time during exposure to 400 nm (3.1 eV) excitation for a long period of time. The conductivity abruptly increased at the beginning and remained almost constant after exposing the sample to light for 40 minutes. The exposure was continued for 70 hours and then turned off. The decay of conductivity with time after turning the light off after 1-hour excitation is shown in FIG. 5A. For photo-excitation of 3.39 and 3.22 eV, an immediate decline in electron conduction was observed after turning off light. However, in the case of 3.1 eV excitation, the conductivity gradually decreased and attained the value of dark conductivity after 8 minutes. This indicates the presence of more than one localized state in the band gap and that the 3.1 eV light most likely excites an electron from a center that exhibits a metastable state with longer decay time. FIG. 5B (the blue curve) shows the decay of conductivity as a function of time after the 70 hours exposure to 3.1 eV excitation. After decay, the sample was then re-exposed to 3.1 eV photons for 10 minutes. The red curve in FIG. 5B represents the subsequent decay of conductivity. Each of the decay curves in FIG. 5B exhibits two time decay constants, one relatively fast and one slow. The fast decay rate of conductivity was 0.4 $\Omega^{-1}$ $cm^{-1}$/min after 1 h excitation, 0.008 $\Omega^{-1}$ $cm^{-1}$/min after 70 h excitation, and 0.004 $\Omega^{-1}$ $cm^{-1}$/min after repeating photoexcitation with higher intensity. The dependence of photoconductivity decay on excitation time is unusual. However, these measurements clearly demonstrate the strong dependence of decay rate of conductivity on the energy, intensity, and time of photo-excitation. It is interesting that repeated exposure to light significantly impacts the decay of conductivity, leading to a more stable electron conduction.

To further investigate the conditions that cause the permanent transition from insulator to conductor state, an undoped $Ga_2O_3$ sample was exposed to light several times and the conductivity was monitored. Initially the conductivity was $1.08\times10^{-8}\Omega^{-1}\cdot cm^{-1}$. When exposed to photo-excitation of 3.1 eV, the conductivity promptly increased by almost two orders of magnitude but retained nearly the same initial value after the light was turned off. However, by repeating photo-excitation and after prolonged exposure to light, the conductivity was increased by 9 orders of magnitude and was held after turning off the light without decay, indicating a complete conversion from the insulator to conductor state. Annealing the sample at 400° C. for 1 hour in dark did not remove or decrease the conductivity. Annealing at a much higher temperature of 800° C. for 2 hours in $O_2$ flow was necessary to revert the sample to an insulator with a conductivity of $7.69\times10^{-7}\Omega^{-1}\cdot cm^{-1}$. However, this annealing also completely eliminated the photoconductivity feature of the sample. FIG. 6 summarizes these results.

Defects are thought to provide localized states in the band gap and lead to persistent photoconductivity. The unusual permanent conversion from insulator to conductor observed here and the ability to eliminate this effect by annealing in $O_2$ at high temperatures confirm the significant role of defects. To investigate the presence and nature of defects in $Ga_2O_3$ samples, positron annihilation spectroscopy (PAS), which is a well-established technique to probe vacancy type defects, was carried out. Positron annihilation lifetime measurements (PALS) were performed using gamma-induced positron spectroscopy (GIPS) at the ELBE (Electron Linac with high Brilliance and low Emittance) facility, at the Helmholtz-Zentrum Dresden-Rossendorf (HZDR) in Dresden, Germany GIPS is an advanced PAS technique that can generate a positron decay curve free from background or source contributions. It uses high-energy γ-rays to generate positrons directly inside the sample by pair production. The main advantage is that it completely eliminates unwanted contributions from positron annihilation in either the source or cladding materials and thus results in accurate measurements of positron lifetimes. PALS measurements on the undoped $Ga_2O_3$ samples used in these examples reveal a lifetime of 187±1 ps. This relatively short lifetime cannot be associated with Ga vacancies which strongly trap positrons, leading to a much longer lifetime. Compared to the reported bulk positron lifetime value of 175 ps in $Ga_2O_3$, the 187 ps measured here is a modest increase above the bulk positron lifetime, a result that often indicates the presence of oxygen vacancies in oxides.

Figure 7A:
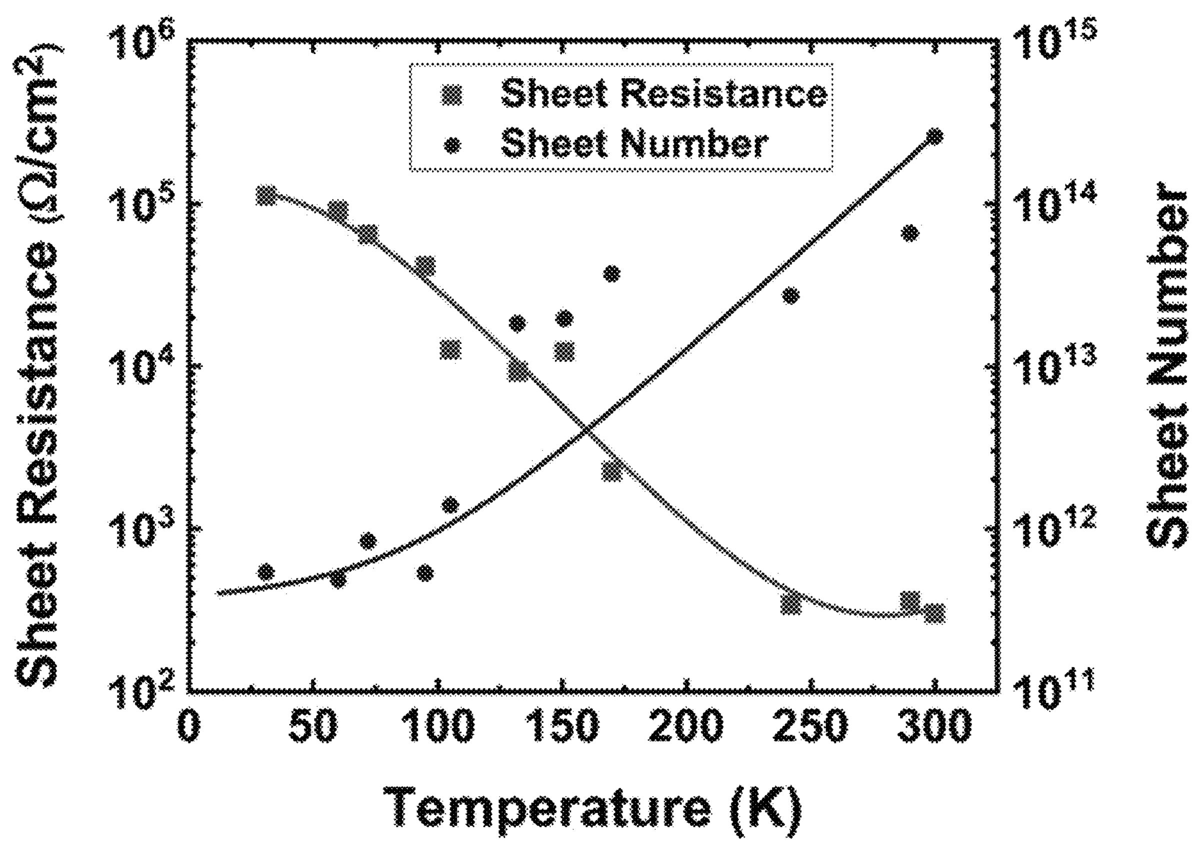
FIGS. 7A-7B: Electronic conduction-temperature characteristics of the permanent state conductivity in $Ga_2O_3$.
Figure 7B:
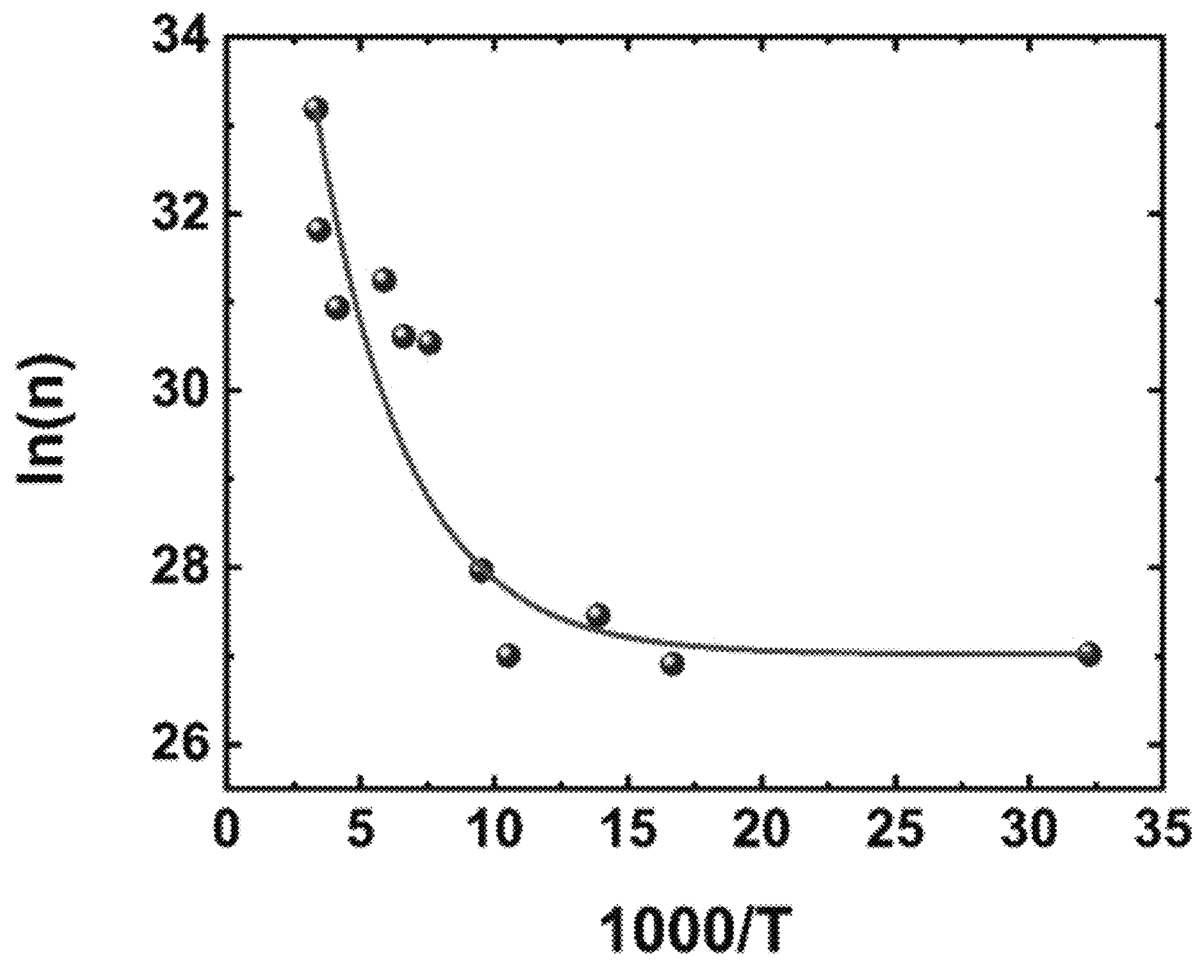

Based on PAS measurements and oxygen-annealing experiments, the persistent photoconductivity in these undoped $Ga_2O_3$ crystals is related to the presence of large concentrations of oxygen vacancies. The results are explained as follows: an oxygen vacancy VO in its neutral charge state forms a localized occupied deep state in the band gap and does not lead to conductivity. By exposing the sample to sub-band gap light, electrons are pumped to the conduction band through two excitation steps producing a $VO^{2+}$ state, which may provide shallow states. In fact, the temperature dependence of the induced conductivity and the electron density presented in FIG. 7 shows a freeze out region for the electrons indicating that these new states are still within the band gap.

Figure 8A:
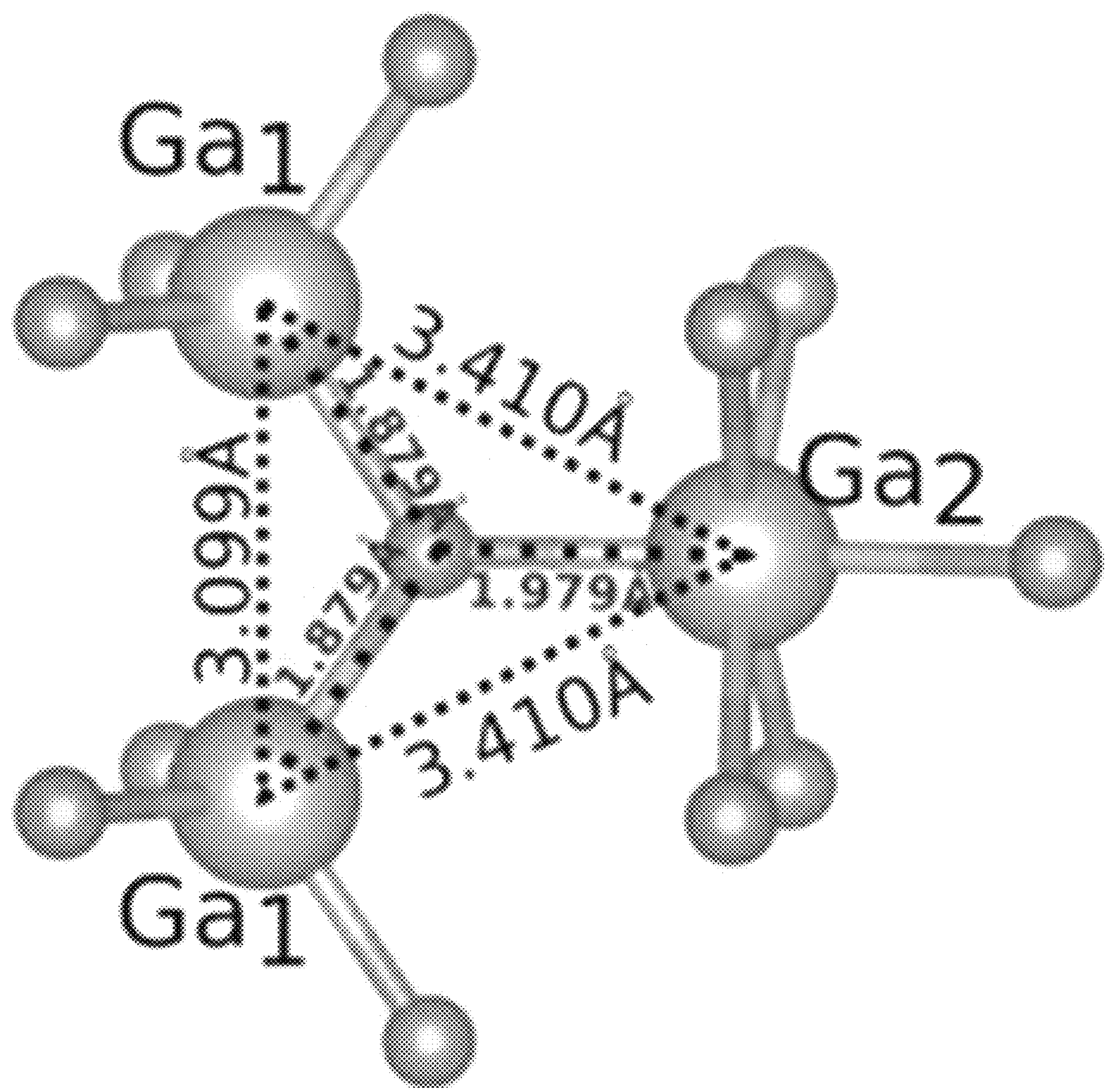
FIGS. 8A-8C: Internal structural arrangements in β-$Ga_2O_3$.
Figure 8B:
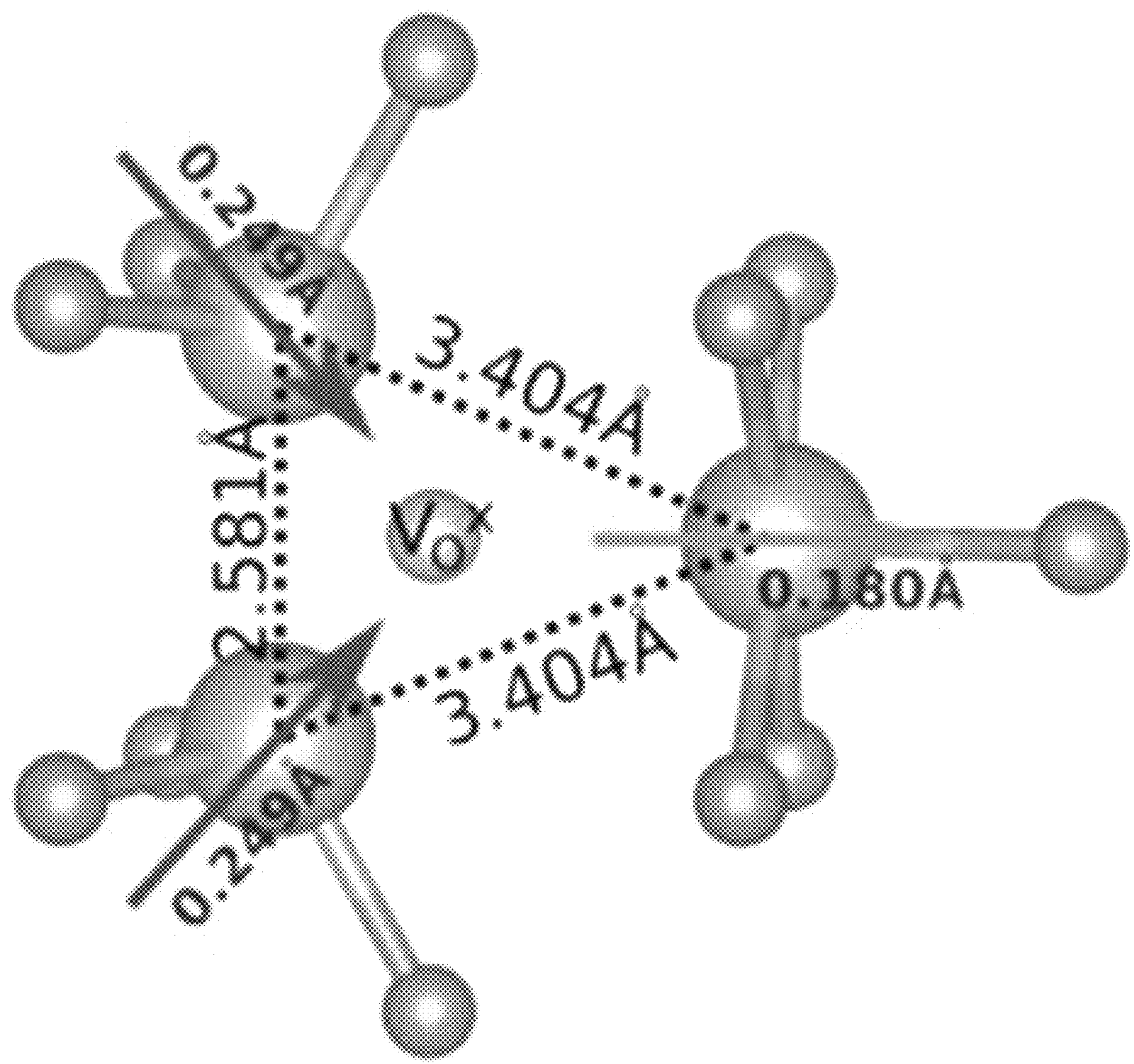
Figure 8C:
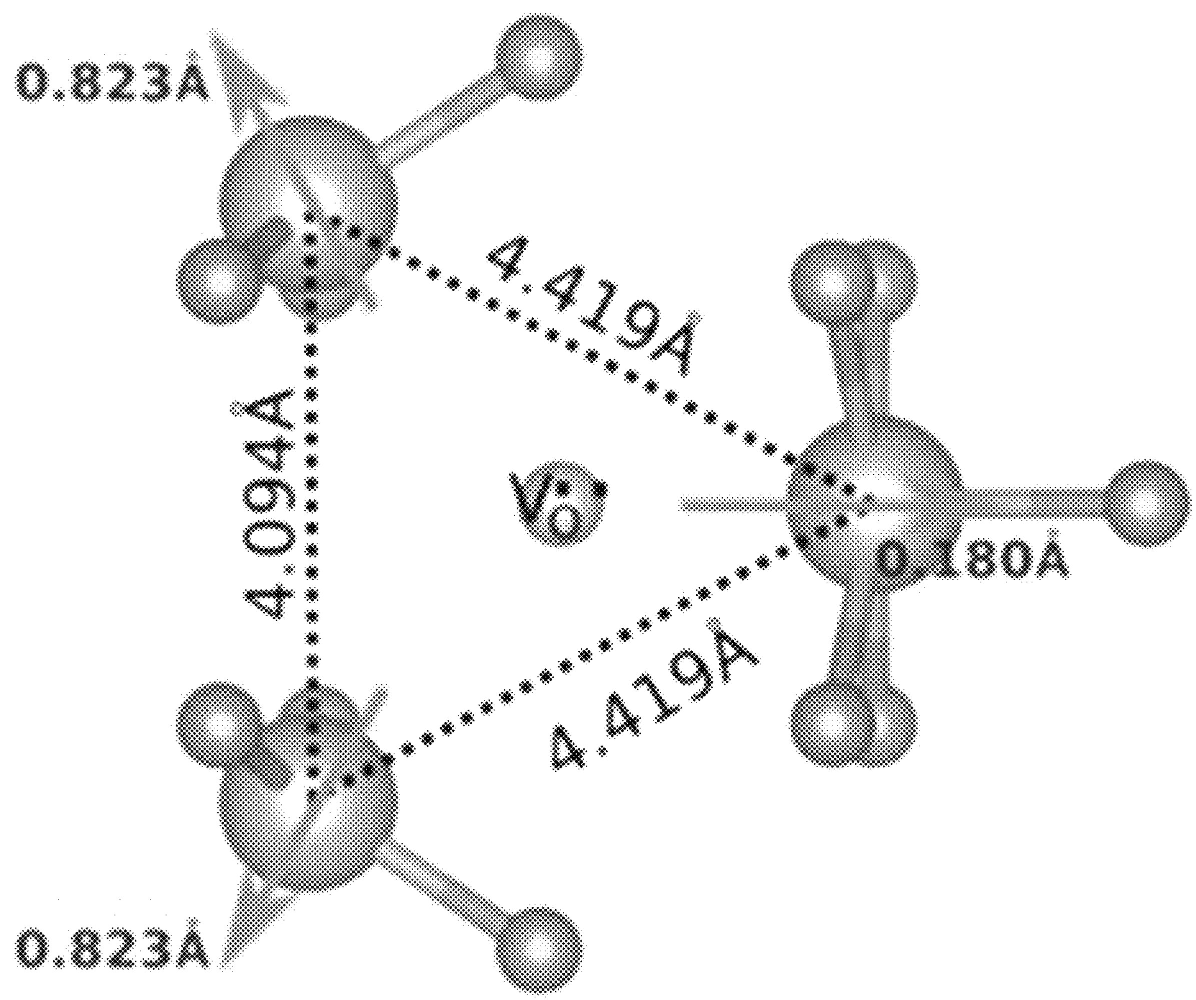

To understand the reason behind the permanent conversion from insulator to conductor and reveal the mechanism that prevented the electrons from returning to their center after turning off light, the change in the structural properties of β-$Ga_2O_3$ was examined by first-principles electronic structure calculations. There are two different types of Ga sites present in the β-$Ga_2O_3$ crystal structure. The first is Ga coordinated by four oxygen (denoted as Ga1) while the second is Ga coordinated with six oxygen (denoted as Ga2 as shown in FIG. 8). The structure also possesses three inequivalent oxygen sites, two 3-fold coordinated O(I) and O(II) sites, and one 4-fold coordinated O(III) site. Out of these three different sites, the O(II) site has the lowest formation energy for a neutral oxygen vacancy. Therefore, in these examples, O(II) type vacancy was focused on to evaluate the structural distortion due to the net charge on the defect. It was observed that in the presence of the neutral (VOX) and charged (VO . . . ) oxygen vacancy, the Ga-triangle (formed by the vacancy surrounded by three Ga atoms, denoted by the black dotted line in FIG. 8) contracts and expands respectively as the net charge on the vacancy is changed from neutral to positive. The average Ga—Ga bond length is 3.129 □ and 4.311 □, respectively, for the neutral and charged cases. (For comparison, in the pristine (non-defective) structure, the average Ga—Ga bond length is 3.306 □.) More specifically, in the case of VOX, two Ga1 type atoms relax towards the vacancy site while the Ga2 type atom relaxes away from the vacancy. In contrast, in the VO . . . case, both the Ga1 and Ga2 type atoms relax away from the vacancy. The variation of the distance of Ga atoms from the vacancy with respect to the pristine structure is shown in FIG. 8. Therefore, inward and outward relaxation of the Ga-triangle decreases (for VOX) and increases (for VO . . . ) the average Ga—Ga bond length with respect to the pristine case.

To scrutinize the structural distortion around the vacancy, the electron localization function (ELF) was analyzed in the three systems. The ELF gives a direct space representation of the electron distribution, which is useful for examining bonding features. The local value of the ELF at a position can be interpreted as the probability of finding an electron at that locality given the existence of neighboring electrons.

Figure 9A:
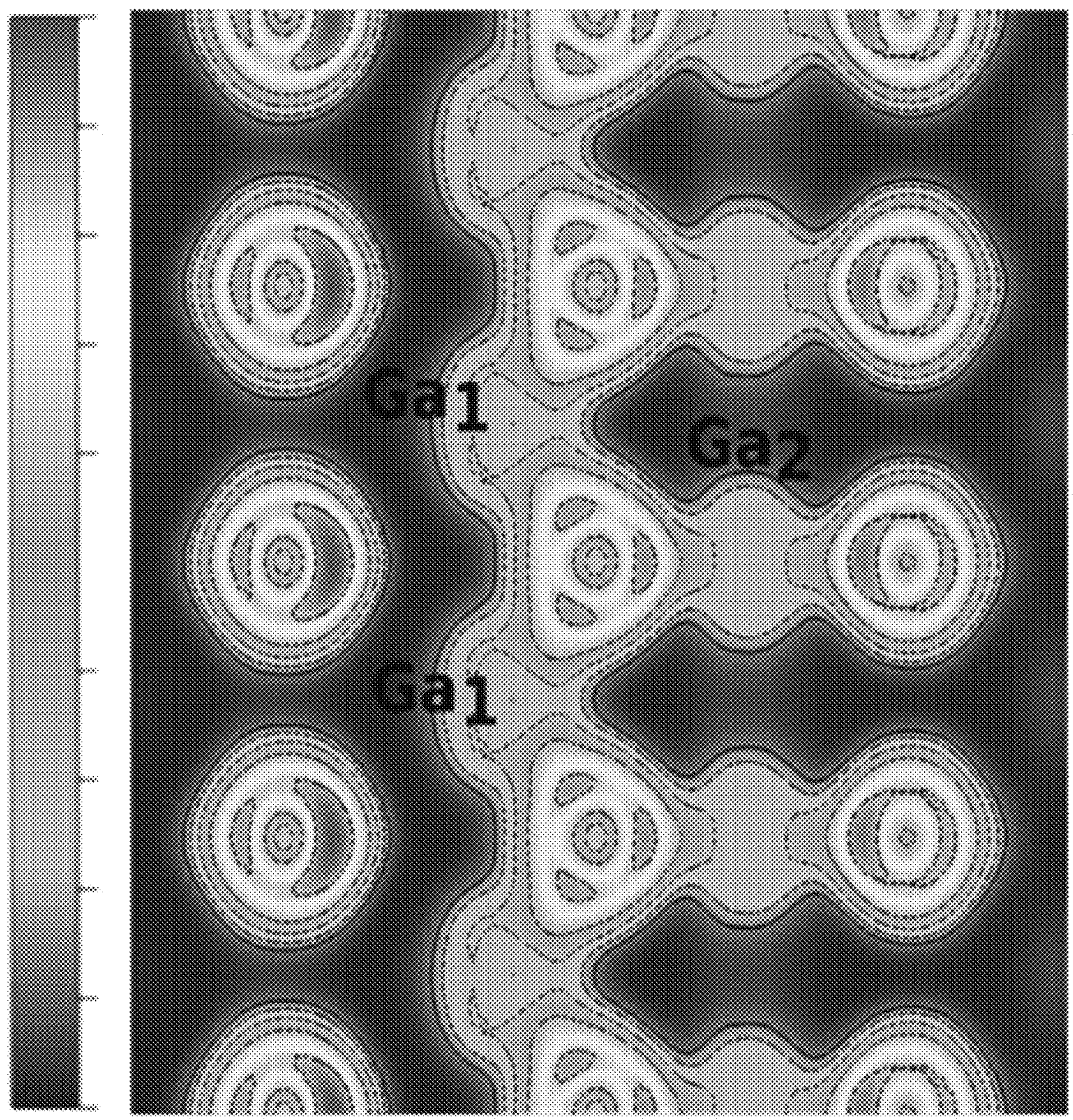
FIGS. 9A-9C: Two-dimensional contour plots of the electron localization function (ELF) for pristine $Ga_2O_3$ (FIG. 9A), $Ga_2O_3$ containing a neutral oxygen vacancy (FIG. 9B), and $Ga_2O_3$ containing a 2+ charged oxygen vacancy (FIG. 9C). Blue, green, and red correspond to ELF values of 0, 0.5, and 1, respectively.
Figure 9B:
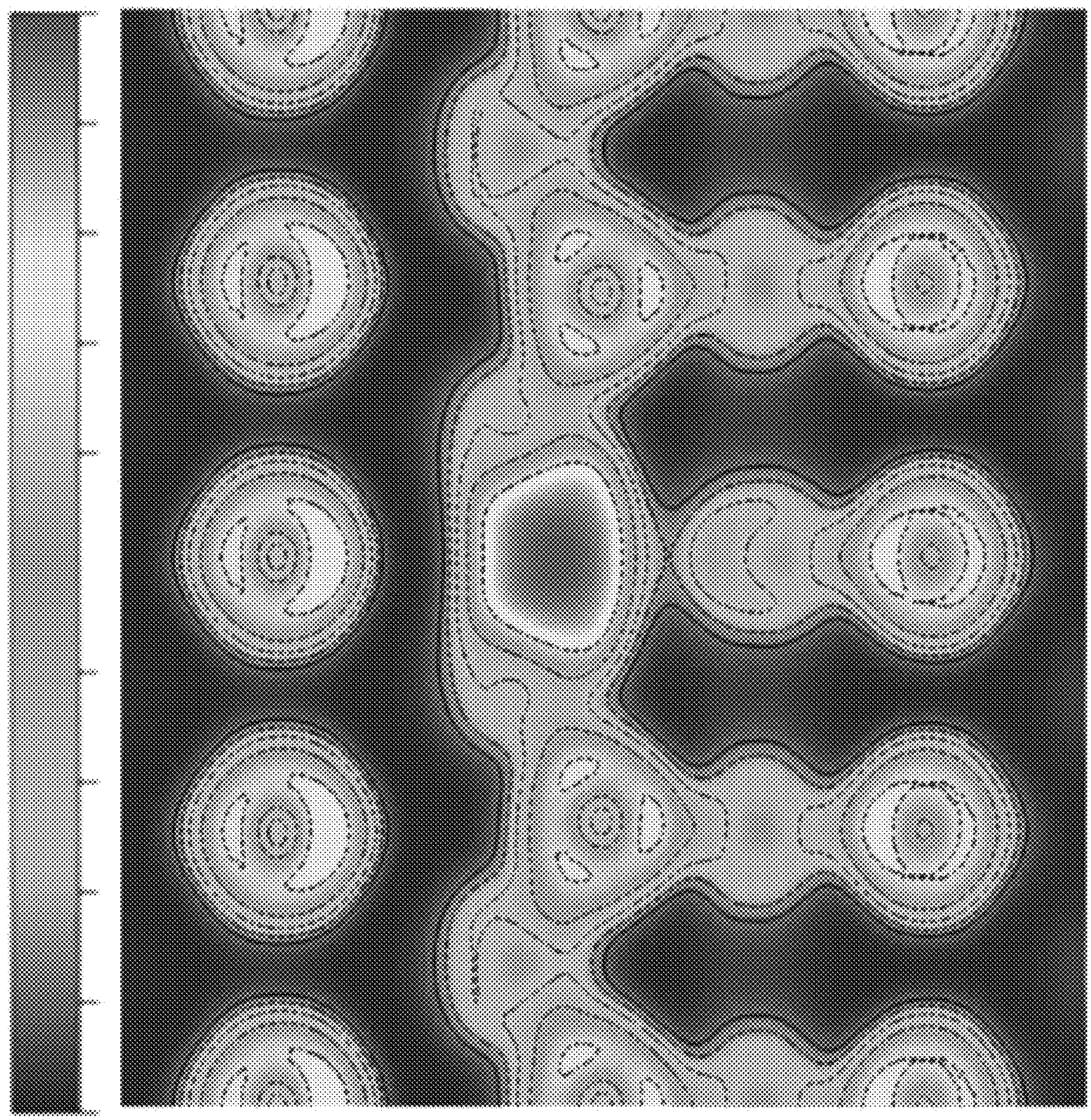
Figure 9C:
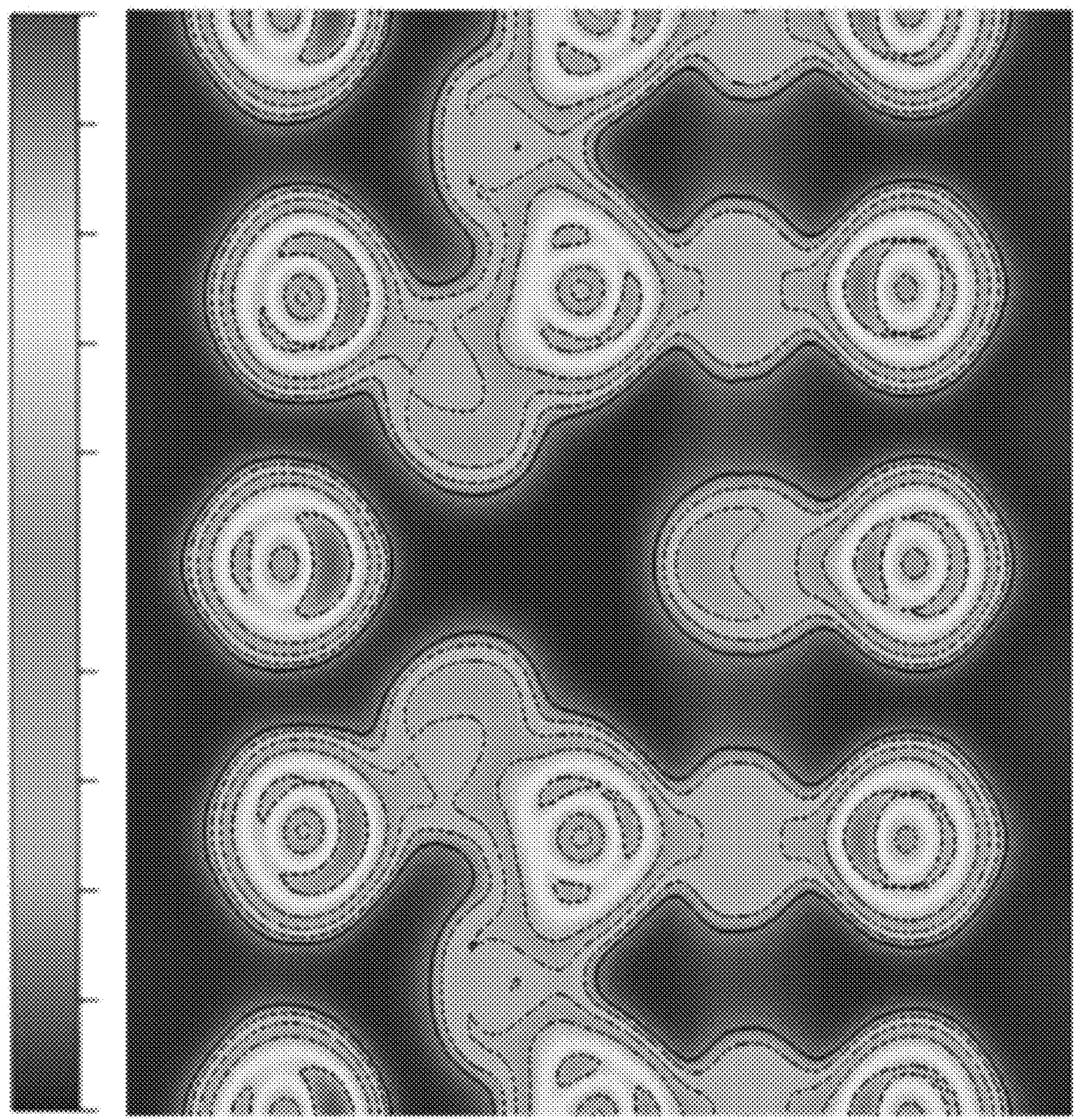

The value of the ELF ranges from 0 to 1. ELF values close to one indicate a region of space with high probability of finding electron localization, whereas a value of zero corresponds to a region where either the electron is fully delocalized or does not reside. Finally, an ELF value close to one-half indicates that the region exhibits electron gas-like behavior. Two-dimensional ELF contour plots of pristine $Ga_2O_3$ and $Ga_2O_3$ containing a neutral vacancy and charged vacancy are shown in FIG. 9. The electron localization on Ga is lower than on O, but there is strong overlap of electron localization. Redistribution of the electron localization probability is depicted for the case of the neutral O vacancy in FIG. 9B, where a strong probability of finding an electron is observed between two Ga atoms near the vacancy site. This reduces the $Ga_1$—$Ga_2$ bond length and pushes $Ga_1$ towards the defect site. The $Ga_2$ atom also interacts slightly with this localized charged state, but it has a much stronger interaction with the neighboring O, which pulls $Ga_2$ away from the defect site. In the charged vacancy case (FIG. 9C), an ELF quite similar to the pristine case is observed except around the defect site. Moreover, the ELF does not exhibit the localized charge state between two $Ga_1$ atoms. Rather, the $Ga_1$ atoms are displaced from their original positions and move away from the defect site to form a new $Ga_1$—O bond. However, the ELF of the $Ga_2$ atom is similar to the neutral vacancy case. This results in the massive expansion of the Ga triangle and corresponding increase in $Ga_1$—$Ga_1$, $Ga_1$—$Ga_2$ bond lengths.

Figure 10A:
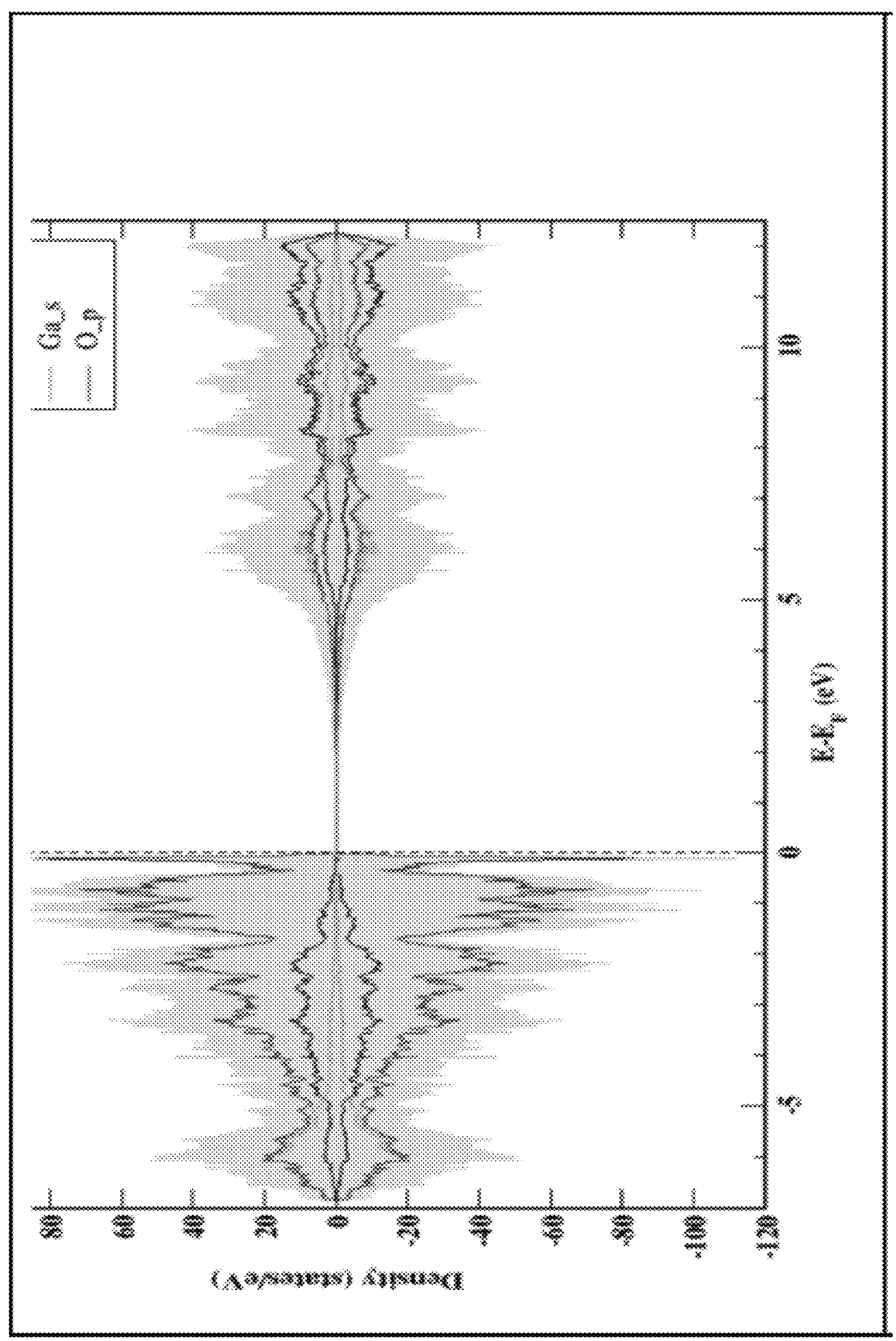
FIGS. 10A-10C: Total (gray) and partial (lines) electronic density of states (DOS) of pristine $Ga_2O_3$ (FIG. 10A) and $Ga_2O_3$ with a neutral (FIG. 10B) and charged (FIG. 10C) oxygen vacancy. The s and p partial DOS for Ga and the p partial DOS for oxygen are represented by the green, blue, and red lines, respectively. The zero of energy is referenced against the highest occupied state in the system, referred to here as the Fermi energy EF.
Figure 10B:
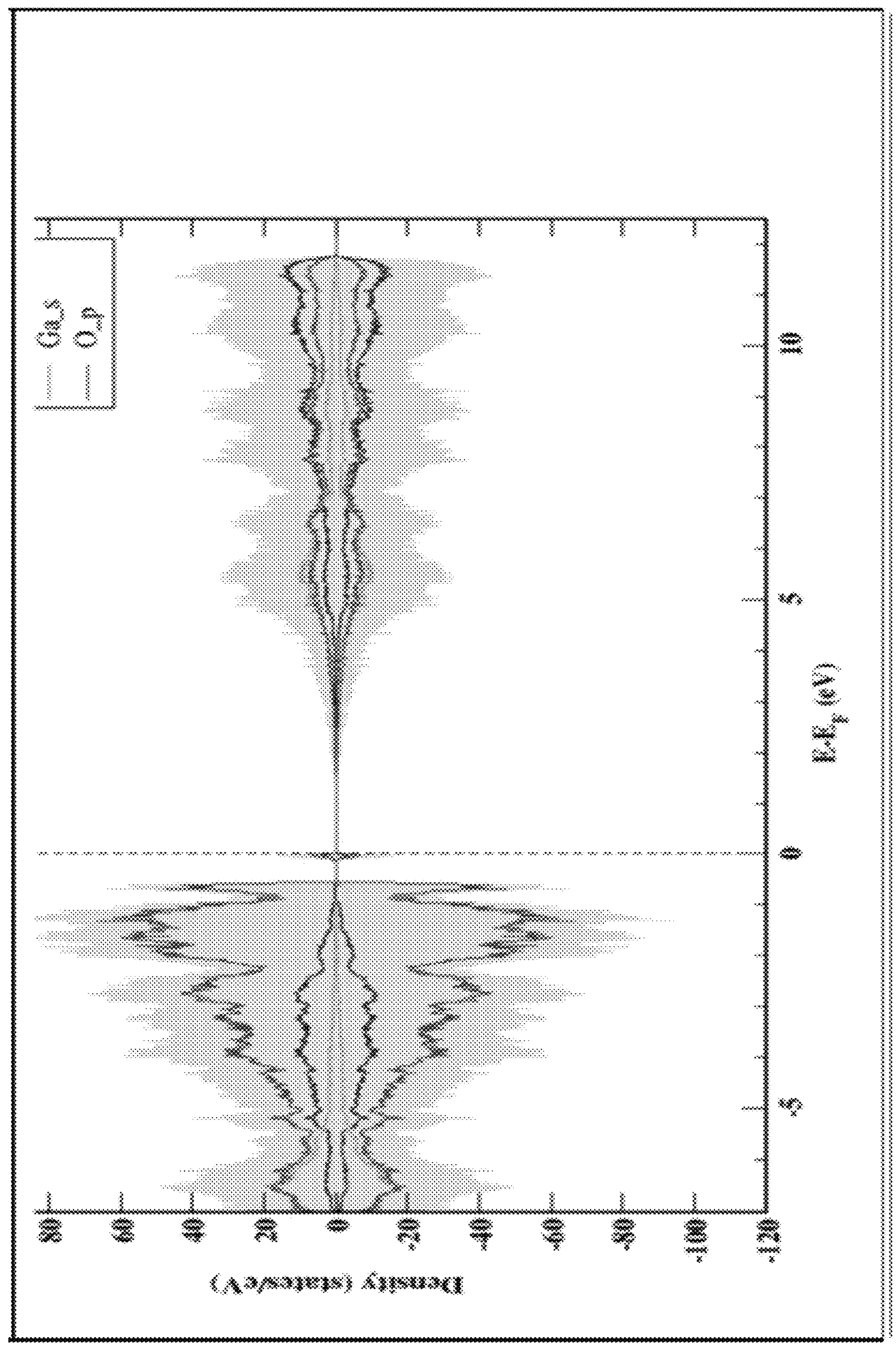
Figure 10C:
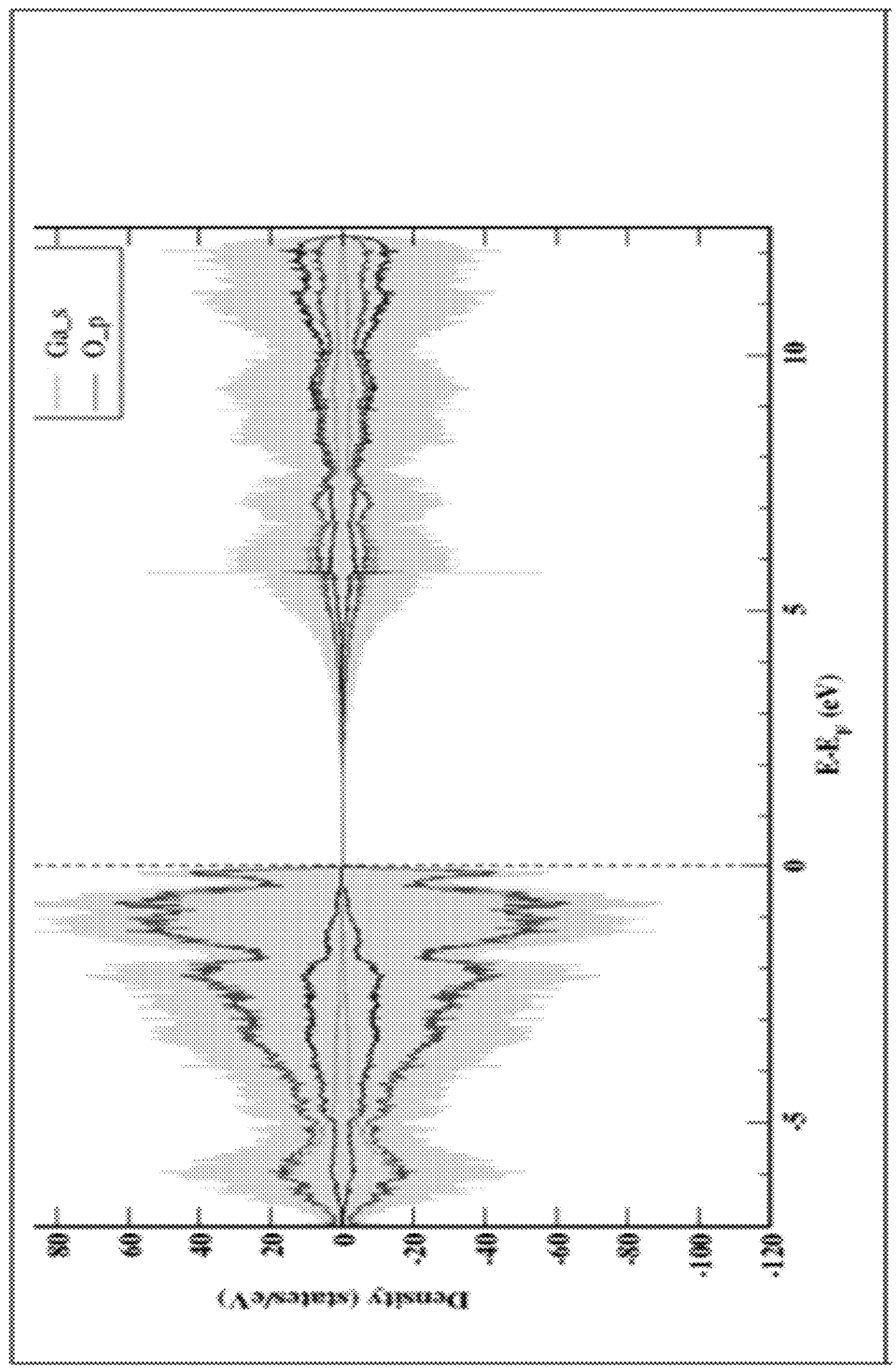

The total and partial electronic density of states (DOS) are plotted in FIG. 10 to provide insight about the impact of the structural relaxation of neutral and charged vacancy on the electronic states within the material. The DOS of the pristine structure is also shown for comparison. It is observed in FIG. 10 that the presence of the neutral vacancy introduces an occupied localized state just above the valence band due to the internal inward relaxation shown in FIG. 8B. On the other hand, in the case of the charged oxygen vacancy, the outward relaxation of the Ga-triangle shifts the defect states to higher energy, closer to the conduction band minimum region (in the DOS in FIG. 10, these overlap with the conduction band in a way that makes it difficult to discern them by eye). Those states are now unoccupied.

These calculations reveal that changing the charge state of the vacancy leads to a strong structural relaxation and a change in the defect states in the band gap. They confirm the experimental scenario that the vacancy structure changes when it is excited. Once the vacancy charge state changes, not only is the defect state emptied, but the state shifts significantly towards the conduction band, leading to a situation in which there is no energetic driving force for the excited electrons to re-encounter the vacancy.

Conclusion

These examples reveal a mechanism for insulator conductor transition through the redistribution of electron localization in the lattice induced by altering the charge states of defect centers and the subsequent drastic lattice distortion and large shift in the density of states. The measurements demonstrated that sub-band gap light illumination of undoped $Ga_2O_3$ for a limited time leads to a permanent transition from a highly insulating state to a conductive state that cannot not reversed (short of extremely high temperatures in the presence of oxygen), an unusual and surprising phenomenon with vast implications on both the properties and possible applications of the material. Such mechanism may take place in other wide band gap oxides strongly impacting their properties and applications. The dependence of the decay of conductivity on the photo-excitation time and intensity revealed in these examples may open up a new frontier to tuning material properties and developing devices that can be controlled by light. By limiting the excitation time or decreasing the photon intensity, the conductivity can be generated and erased, providing applicability for optical memory uses. Long time excitation can be used to develop n-type semiconductor for electronics.

Methods

Czochralski (CZ) grown un-doped, Fe-doped, and Mg-doped bulk single crystals of $Ga_2O_3$ were obtained from Synopsis Inc. The as-grown crystals were about 1 cm in diameter and were sliced into pieces of 1 mm thickness. The electrical transport properties of the samples were measured using a MMR Hall effect measurement system. Before the measurement, samples were properly cleaned, and indium contacts were mounted on the surface of each samples. Light emitting diodes (LEDs) of various wavelength (365, 385, 400, 460, 650, and 850 nm) were used to provide photo-excitation of 3.39, 3.22, 3.1, 2.69, 1.9, and 1.45 eV, respectively, and the photo-Hall measurements were carried out at room temperature. The intensity of photo-excitation was varied by changing the current passing through the LEDs. For the photo-Hall measurements, the Hall-effect chamber was customized with a transparent window for the illumination of the sample and a Joule Thompson refrigerator was used to keep the sample temperature constant, overcoming the heating effect caused by light illumination. The refrigerator operates by running high pressure nitrogen gas through thin pipes. Because of the light induced heat, this setup is important for photoconductivity experiments to investigate the change in carrier concentration and conductivity due solely to photoexcitation, without the influence of thermal contributions. Temperature dependent Hall effect measurements were performed on the permanent state conductive sample from 10-300 K using a cryostat with He compressor.

Density Functional Theory Calculations

The structural properties of $\beta$-$Ga_2O_3$ have been investigated by the density functional theory (DFT) formalism as implemented in VASP (Vienna Ab initio Simulation Package). The core electron behaviour and the interaction between the valence electrons and the ion are described by the projector augmented wave method (PAW). The Perdew-Burke-Ernzerhof (PBE) form of the generalized gradient approximation (GGA) was employed as the exchange-correlation functional to obtain the optimized ground state structure. The Brillouin zone was sampled using 3×3×3 and 7×7×7 meshes of Monkhorst-Pack k-points for optimization and electronic structure calculations, respectively. The valence electrons are described by a plane waves basis set with a converged energy cut-off of 520 eV. A supercell of 160 atoms (32 formula unit) was considered in this calculation. The structure was optimized until the calculated Hellmann-Feynman forces were smaller than 0.0001 eV Å-1.

Certain embodiments of the compositions and methods disclosed herein are defined in the above examples. It should be understood that these examples, while indicating particular embodiments of the invention, are given by way of illustration only. From the above discussion and these examples, one skilled in the art can ascertain the essential characteristics of this disclosure, and without departing from the spirit and scope thereof, can make various changes and modifications to adapt the compositions and methods described herein to various usages and conditions. Various changes may be made and equivalents may be substituted for elements thereof without departing from the essential scope of the disclosure. In addition, many modifications may be made to adapt a particular situation or material to the teachings of the disclosure without departing from the essential scope thereof.

What is claimed is:

1. A method for producing a conductive material, the method comprising exposing a wide band gap metal oxide having oxygen vacancies to sub-band gap light for a period of time to induce conductivity in the wide band gap metal oxide and produce a conductive metal oxide having either reversible conductivity or permanent conductivity.

2. The method of claim 1, wherein the wide band gap metal oxide comprises $Ga_2O_3$.

3. The method of claim 1, further comprising raising the temperature of the wide band gap metal oxide to an elevated temperature to eliminate the reversible conductivity.

4. The method of claim 1, wherein the conductive metal oxide has reversible conductivity and is in an optical memory device.

5. The method of claim 1, wherein the sub-band gap light is at an intensity of about $1.81\times10^{17}$ photons/cm$^2$·s, and the period of time is at least 1 hour.

6. The method of claim 5, wherein the wide band gap metal oxide with induced conductivity comprises n-type $Ga_2O_3$ with permanent conductivity.

7. The method of claim 1, wherein the period of time ranges from about 1 minute to about 100 hours.

8. The method of claim 1, wherein the sub-band gap light is at an energy ranging from about 1.45 eV to about 3.39 eV.

9. The method of claim 1, wherein the sub-band gap light is at an energy of about 3.1 eV.

10. The method of claim 1, wherein the sub-band gap light has an intensity ranging from about $1\times10^{15}$ photons/cm$^2$·s to about $1\times10^{19}$ photons/cm$^2$·s.

11. The method of claim 1, wherein the sub-band gap light has an intensity of about $1.81\times10^{17}$ photons/cm$^2$·s.

12. The method of claim 1, wherein the period of time is at least about 1 hour.

13. The method of claim 1, wherein the period of time is at least about 70 hours.

14. A method for producing a conductor, the method comprising exposing an insulator material to light at a sufficient energy and intensity, and for a sufficient time, to induce permanent conductivity in the insulator material and thereby produce a conductor material, wherein the insulator material comprises $Ga_2O_3$ having oxygen vacancies.

15. The method of claim 14, wherein the insulator material is undoped.

16. The method of claim 14, wherein the method does not involve doping the insulator material.

17. A method for tuning material properties, the method comprising:

providing a wide band gap metal oxide material having oxygen vacancies; and exposing the wide band gap metal oxide material to a desired intensity of sub-band gap light for a desired amount of time so as to induce conductivity in the wide band gap metal oxide material and tune the conductivity in a desired manner.

18. The method of claim 17, wherein the wide band gap metal oxide material comprises $Ga_2O_3$.

* * * * *